US008320516B2

(12) United States Patent
Toyotaka

(10) Patent No.: US 8,320,516 B2
(45) Date of Patent: Nov. 27, 2012

(54) PULSE SIGNAL OUTPUT CIRCUIT AND SHIFT REGISTER

(75) Inventor: Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 30 days.

(21) Appl. No.: 13/031,717

(22) Filed: Feb. 22, 2011

(65) Prior Publication Data

US 2011/0216874 A1 Sep. 8, 2011

(30) Foreign Application Priority Data

Mar. 2, 2010 (JP) ................................. 2010-044949

(51) Int. Cl.
*G11C 19/00* (2006.01)

(52) U.S. Cl. ................. 377/64; 377/68; 377/69; 377/79

(58) Field of Classification Search ........................ None
See application file for complete search history.

(56) References Cited

U.S. PATENT DOCUMENTS

| 5,731,856 | A  | 3/1998  | Kim et al.       |
|-----------|----|---------|------------------|
| 5,744,864 | A  | 4/1998  | Cillessen et al. |
| 6,294,274 | B1 | 9/2001  | Kawazoe et al.   |
| 6,563,174 | B2 | 5/2003  | Kawasaki et al.  |
| 6,727,522 | B1 | 4/2004  | Kawasaki et al.  |
| 6,813,332 | B2 | 11/2004 | Nagao et al.     |
| 7,049,190 | B2 | 5/2006  | Takeda et al.    |
| 7,061,014 | B2 | 6/2006  | Hosono et al.    |
| 7,064,346 | B2 | 6/2006  | Kawasaki et al.  |
| 7,105,868 | B2 | 9/2006  | Nause et al.     |
| 7,116,748 | B2 | 10/2006 | Nagao et al.     |
| 7,211,825 | B2 | 5/2007  | Shih et al       |
| 7,282,782 | B2 | 10/2007 | Hoffman et al.   |
| 7,297,977 | B2 | 11/2007 | Hoffman et al.   |
| 7,323,356 | B2 | 1/2008  | Hosono et al.    |
| 7,369,111 | B2 * | 5/2008 | Jeon et al. ..................... 345/100 |
| 7,385,224 | B2 | 6/2008  | Ishii et al.     |
| 7,397,885 | B2 | 7/2008  | Moon et al.      |
| 7,402,506 | B2 | 7/2008  | Levy et al.      |

(Continued)

FOREIGN PATENT DOCUMENTS

EP    1 737 044 A1    12/2006

(Continued)

OTHER PUBLICATIONS

International Search Report, PCT Application No. PCT/JP2011/052795, dated Apr. 12, 2011, 2 pages.

(Continued)

*Primary Examiner* — Tuan T Lam
(74) *Attorney, Agent, or Firm* — Fish & Richardson P.C.

(57) ABSTRACT

An object of the present invention is to provide a pulse signal output circuit capable of operating stably and a shift register including the pulse signal output circuit. In an embodiment of the pulse signal output circuit, a transistor has a source terminal or a drain terminal connected to a gate electrode of another transistor having a source terminal or a drain terminal forming an output terminal of the pulse signal output circuit, the channel length of the transistor being longer than the channel length of the other transistor. Thereby, the amount of a leakage current modifying the gate potential of the other transistor can be reduced, and a malfunction of the pulse signal output circuit can be prevented.

17 Claims, 14 Drawing Sheets

U.S. PATENT DOCUMENTS

| | | |
|---|---|---|
| 7,411,209 B2 | 8/2008 | Endo et al. |
| 7,450,681 B2 | 11/2008 | Wei et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,590,214 B2 | 9/2009 | Liu et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0140839 A1 | 7/2004 | Nagao et al. |
| 2005/0017302 A1 | 1/2005 | Hoffman |
| 2005/0062515 A1 | 3/2005 | Nagao et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0080661 A1* | 4/2008 | Tobita ............................ 377/78 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258998 A1 | 10/2008 | Miyake |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0148846 A1* | 6/2011 | Arasawa et al. ............... 345/212 |
| 2011/0216875 A1* | 9/2011 | Miyake ......................... 377/75 |
| 2011/0216876 A1* | 9/2011 | Amano et al. .................. 377/75 |
| 2011/0285675 A1* | 11/2011 | Amano et al. ................. 345/204 |
| 2011/0285688 A1* | 11/2011 | Miyake et al. ................ 345/211 |
| 2012/0082287 A1* | 4/2012 | Moriwaki ...................... 377/64 |
| 2012/0087460 A1* | 4/2012 | Moriwaki ...................... 377/64 |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-226429 A | 8/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-122939 A | 5/2008 |
| WO | 2004/114391 A1 | 12/2004 |

OTHER PUBLICATIONS

Written Opinion, PCT Application No. PCT/JP2011/052795, dated Apr. 12, 2011, 4 pages.

Takeshi Osada et al.; "Development of Driver-Integrated Panel using Amorphous In—Ga—Zn-Oxide TFT"; SID Digest '09 : SID International Symposium Digest of Technical Papers; May 31, 2009; pp. 184-187.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp.621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C,"Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

OHara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

OHara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," Imid '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

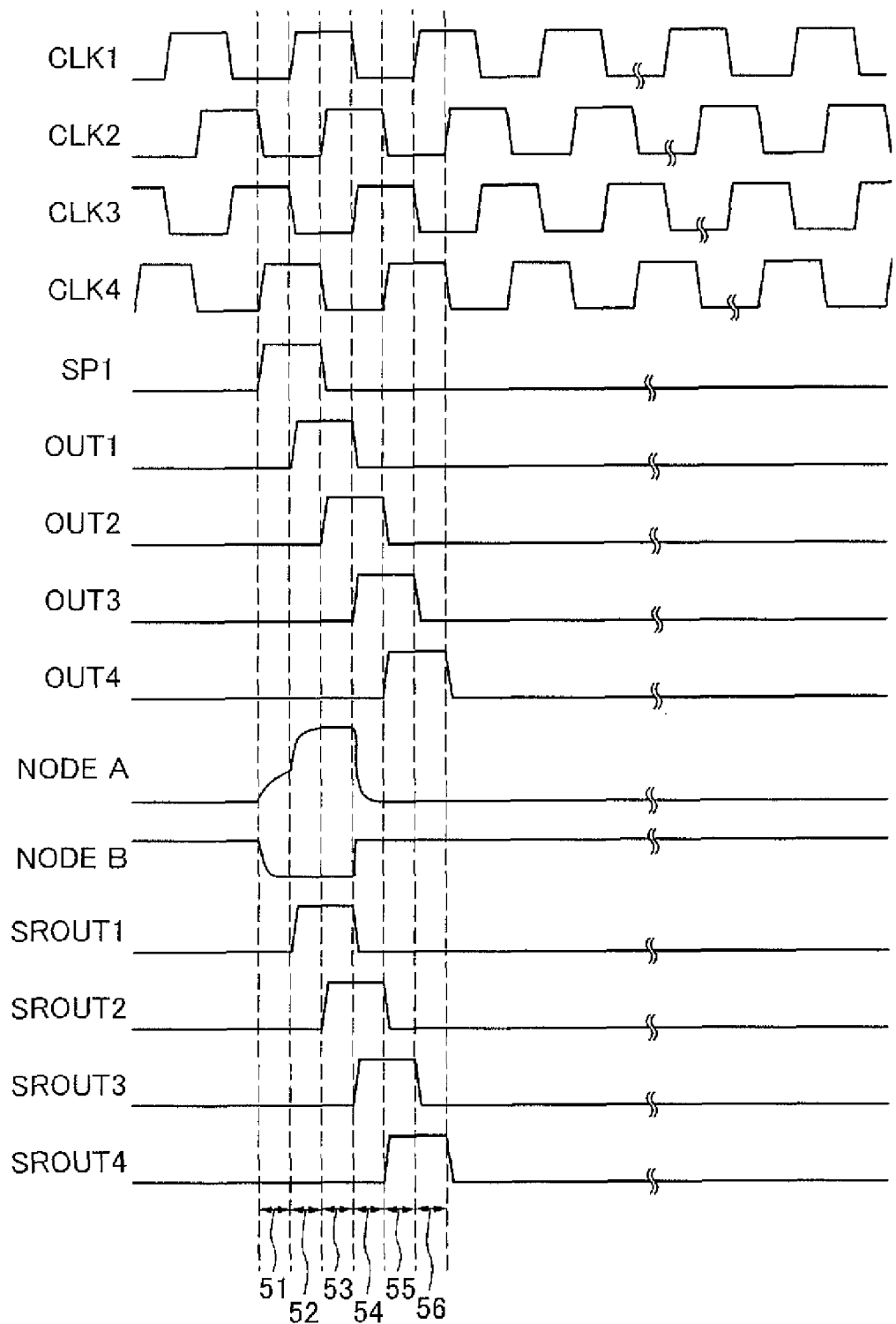

PULSE SIGNAL OUTPUT CIRCUIT AND SHIFT REGISTER

TECHNICAL FIELD

The disclosed invention relates to pulse signal output circuits and shift registers.

BACKGROUND ART

Transistors formed over flat plates such as glass substrates and typically used in liquid crystal display devices generally include semiconductor materials such as amorphous silicon or polycrystalline silicon. Although transistors including amorphous silicon have low field effect mobility, they can be formed over large glass substrates. In contrast, although transistors including polycrystalline silicon have high field effect mobility, they need a crystallization process such as laser annealing and are not always suitable for large glass substrates.

On the other hand, transistors including oxide semiconductors as semiconductor materials have attracted attention. For example, Patent Documents 1 and 2 disclose techniques by which a transistor is formed using zinc oxide or an In—Ga—Zn—O-based oxide semiconductor as a semiconductor material and is used as a switching element of an image display device.

Transistors including oxide semiconductors in channel regions have higher field effect mobility than transistors including amorphous silicon. Further, oxide semiconductor films can be formed at a temperature of 300° C. or lower by a sputtering method or the like; thus, a manufacturing process of transistors including an oxide semiconductor is simpler than that of transistors including polycrystalline silicon.

Such transistors including oxide semiconductors are expected to be used as switching elements included in pixel portions and driver circuits of display devices such as liquid crystal displays, electroluminescent displays, and electronic paper. For example, Non-Patent Document 1 discloses a technique by which a pixel portion and a driver circuit of a display device include transistors including oxide semiconductors.

Note that transistors including oxide semiconductors are all n-channel transistors. Therefore, in the case where a driver circuit includes transistors including oxide semiconductors, the driver circuit includes only n-channel transistors.

[Patent Document]
[Patent Document 1] Japanese Published Patent Application No. 2007-123861
[Patent Document 2] Japanese Published Patent Application No. 2007-096055
[Non-Patent Document]
[Non-Patent Document 1] T. Osada et al., "Development of Driver-Integrated Panel using Amorphous In—Ga—Zn-Oxide TFT", *Proc. SID '09 Digest*, 2009, pp. 184-187.

DISCLOSURE OF INVENTION

A driver circuit includes, for example, a shift register having a pulse signal output circuit. In the case where the shift register includes transistors having the same conductivity type, the shift register might have a problem of unstable operation, for example.

In view of the problem, an object of one embodiment of the present invention is to provide a pulse signal output circuit capable of operating stably and a shift register including the pulse signal output circuit.

One of objects of the present invention is to provide a pulse signal output circuit capable of operating stably and a shift register including the pulse signal output circuit. In an embodiment of the pulse signal output circuit, a transistor has a source terminal or a drain terminal connected to a gate electrode of another transistor having a source terminal or a drain terminal forming an output terminal of the pulse signal output circuit, the channel length of the transistor being longer than the channel length of the other transistor. Thereby, the amount of a leakage current modifying the gate potential of the other transistor can be reduced, and a malfunction of the pulse signal output circuit can be prevented.

A concrete example of a configuration that can be employed is described below.

An embodiment of the present invention is a pulse signal output circuit including first to ninth transistors, a first input signal generation circuit, and a second input signal generation circuit. A first terminal of the first transistor and a first terminal of the second transistor are electrically connected to a first output terminal, and a first terminal of the third transistor and a first terminal of the fourth transistor are electrically connected to a second output terminal. The first input signal generation circuit includes the fifth transistor and the sixth transistor. A first terminal of the fifth transistor and a first terminal of the sixth transistor are electrically connected to each other and collectively function as an output terminal of the first input signal generation circuit. The second input signal generation circuit includes the seventh to ninth transistors. A second terminal of the seventh transistor, a second terminal of the eighth transistor, and a first terminal of the ninth transistor are electrically connected to each other and collectively function as an output terminal of the second input signal generation circuit. A gate terminal of the first transistor, a gate terminal of the third transistor, and the output terminal of the first input signal generation circuit are electrically connected to each other. A gate terminal of the second transistor, a gate terminal of the fourth transistor, and the output terminal of the second input signal generation circuit are electrically connected to each other. A channel length of the sixth transistor is longer than a channel length of the third transistor and longer than a channel length of the fourth transistor. A channel length of the ninth transistor is longer than the channel length of the third transistor and longer than the channel length of the fourth transistor.

In the pulse signal output circuit, it is preferable that a first clock signal be input to a second terminal of the first transistor and a second terminal of the third transistor; a first potential be supplied to a second terminal of the second transistor, a second terminal of the fourth transistor, a second terminal of the sixth transistor, and a second terminal of the ninth transistor; a second potential which is higher than the first potential be supplied to a second terminal of the fifth transistor, a first terminal of the seventh transistor, and a first terminal of the eighth transistor; a first pulse signal be input to a gate terminal of the fifth transistor and a gate terminal of the ninth transistor; an output signal of the second input signal generation circuit be input to a gate terminal of the sixth transistor; a third pulse signal be input to a gate terminal of the seventh transistor; a second clock signal be input to a gate terminal of the eighth transistor; and a second pulse signal be output from the first output terminal or the second output terminal.

In the pulse signal output circuit, at least one of the sixth transistor and the ninth transistor may be a transistor having a multi-gate structure where at least two gates are arranged in series.

Another embodiment of the present invention is a pulse signal output circuit including first to eleventh transistors, a first input signal generation circuit, and a second input signal generation circuit. A first terminal of the first transistor and a first terminal of the second transistor are electrically connected to a first output terminal, and a first terminal of the third transistor and a first terminal of the fourth transistor are electrically connected to a second output terminal. The first input signal generation circuit includes the fifth to seventh transistors. A first terminal of the fifth transistor, a first terminal of the sixth transistor, and a first terminal of the seventh transistor are electrically connected to each other, and a second terminal of the seventh transistor functions as an output terminal of the first input signal generation circuit. The second input signal generation circuit includes the eighth to eleventh transistors. A second terminal of the eleventh transistor and a first terminal of the ninth transistor are electrically connected to each other, and a second terminal of the ninth transistor, a second terminal of the eighth transistor, and a first terminal of the tenth transistor are electrically connected to each other and collectively function as an output terminal of the second input signal generation circuit. A gate terminal of the first transistor, a gate terminal of the third transistor, and the output terminal of the first input signal generation circuit are electrically connected to each other. A gate terminal of the second transistor, a gate terminal of the fourth transistor, and the output terminal of the second input signal generation circuit are electrically connected to each other. A channel length of the sixth transistor is longer than a channel length of the third transistor and longer than a channel length of the fourth transistor. A channel length of the tenth transistor is longer than the channel length of the third transistor and longer than the channel length of the fourth transistor.

In the pulse signal output circuit, it is preferable that a first clock signal be input to a second terminal of the first transistor and a second terminal of the third transistor; a first potential be supplied to a second terminal of the second transistor, a second terminal of the fourth transistor, a second terminal of the sixth transistor, and a second terminal of the tenth transistor; a second potential which is higher than the first potential be supplied to a second terminal of the fifth transistor, a gate terminal of the seventh transistor, a first terminal of the eighth transistor, and a first terminal of the eleventh transistor; a first pulse signal be input to a gate terminal of the fifth transistor and a gate terminal of the tenth transistor; an output signal of the second input signal generation circuit be input to a gate terminal of the sixth transistor; a third pulse signal be input to a gate terminal of the eighth transistor; a second clock signal be input to a gate terminal of the ninth transistor; a third clock signal be input to a gate terminal of the eleventh transistor; and a second pulse signal be output from the first output terminal or the second output terminal.

In the pulse signal output circuit, at least one of the sixth transistor and the tenth transistor may be a transistor having a multi-gate structure where at least two gates are arranged in series.

In the pulse signal output circuit which is the embodiment of the present invention, a capacitor having a terminal electrically connected to a node where the gate terminal of the second transistor, the gate terminal of the fourth transistor, and the output terminal of the second input signal generation circuit are electrically connected to each other may be included.

In the pulse signal output circuit, at least one of the transistors preferably includes an oxide semiconductor. Further, a shift register can include a plurality of pulse signal output circuits.

Note that in the pulse signal output circuit, the transistor includes an oxide semiconductor in some cases; however, the disclosed invention is not limited to this.

Note that in this specification and the like, a term such as "over" or "below" does not necessarily mean that a component is placed "directly on" or "directly under" another component. For example, the expression "a gate electrode over a gate insulating layer" does not exclude the case where another component is placed between the gate insulating layer and the gate electrode.

In addition, in this specification and the like, terms such as "electrode" and "wiring" do not limit the functions of components. For example, an "electrode" can be used as part of a "wiring", and the "wiring" can be used as part of the "electrode". The terms such as "electrode" and "wiring" can also mean a combination of a plurality of "electrodes" and "wirings", for example.

Functions of a "source" and a "drain" might be interchanged when, for example, a transistor of opposite polarity is used or the direction of current flow is changed in circuit operation. Therefore, in this specification, the terms "source" and "drain" can be interchanged.

Note that in this specification and the like, the term "electrically connected" includes the case where components are connected to each other through an object having any electric function. Here, there is no particular limitation on all object having any electric function as long as electric signals can be transmitted and received between components that are connected to each other through the object.

Examples of an "object having any electric function" are a switching element such as a transistor, a resistor, an inductor, a capacitor, and an element with a variety of functions in addition to an electrode and a wiring.

A pulse signal output circuit capable of operating stably and a shift register including the pulse signal output circuit can be provided.

BRIEF DESCRIPTION OF DRAWINGS

FIG. 2 is a timing chart of a shift register.

BEST MODE FOR CARRYING OUT THE INVENTION

Figure 1A:
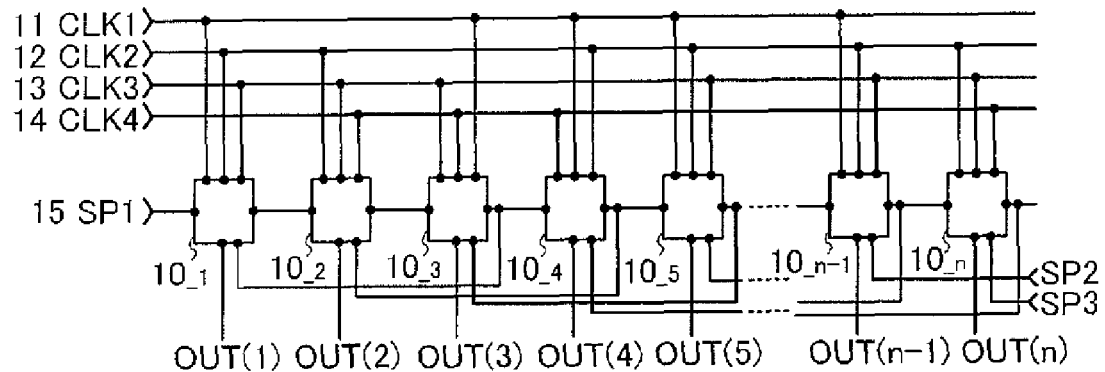
FIGS. 1A to 1C illustrate configuration examples of a pulse signal output circuit and a shift register.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Note that in this specification and the like, ordinal numbers such as "first", "second", and "third" are used in order to avoid confusion among components and do not limit the number.

(Embodiment 1)

In this embodiment, configuration examples of a pulse signal output circuit and a shift register including the pulse signal output circuit will be described with reference to FIGS. 1A to 1C, FIG. 2, FIGS. 3A to 3C, and FIGS. 4A to 4C.

<Circuit Configuration>

First, examples of circuit configurations of a pulse signal output circuit and a shift register including the pulse signal output circuit will be described with reference to FIGS. 1A to 1C.

A shift register described in this embodiment includes first to n-th pulse signal output circuits $10\_1$ to $10\_n$ (n≧2) and first to fourth signal lines 11 to 14 which transmit clock signals (see FIG. 1A). A first clock signal (CLK1) is supplied to the first signal line 11. A second clock signal (CLK2) is supplied to the second signal line 12. A third clock signal (CLK3) is supplied to the third signal line 13. A fourth clock signal (CLK4) is supplied to the fourth signal line 14.

The clock signal is a signal which alternates between an H-level signal (high potential) and an L-level signal (low potential) at regular intervals. Here, the first to fourth clock signals (CLK1 to CLK4) are delayed by ¼ period sequentially. In this embodiment, by using the clock signals, control or the like of the pulse signal output circuit is performed.

Figure 1B:
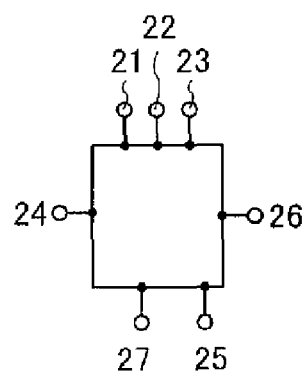

Each of the first to n-th pulse signal output circuits $10\_1$ to $10\_n$ includes a first input terminal 21, a second input terminal 22, a third input terminal 23, a fourth input terminal 24, a fifth input terminal 25, a first output terminal 26, and a second output terminal 27 (see FIG. 1B).

The first input terminal 21, the second input terminal 22, and the third input terminal 23 are electrically connected to any of the first to fourth signal lines 11 to 14. For example, the first input terminal 21 in the first pulse signal output circuit $10\_1$ is electrically connected to the first signal line 11, the second input terminal 22 in the first pulse signal output circuit $10\_1$, is electrically connected to the second signal line 12, and the third input terminal 23 in the first pulse signal output circuit $10\_1$, is electrically connected to the third signal line 13. In addition, the first input terminal 21 in the second pulse signal output circuit $10\_2$ is electrically connected to the second signal line 12, the second input terminal 22 in the second pulse signal output circuit $10\_2$ is electrically connected to the third signal line 13, and the third input terminal 23 in the second pulse signal output circuit $10\_2$ is electrically connected to the fourth signal line 14. Note that here, the case where the second to fourth signal lines 12 to 14 are connected to the n-th pulse signal output circuit $10\_n$ is described. However, which signal lines are connected to the n-th pulse signal output circuit $10\_n$ depends on the value of n. Thus, it is to be noted that the configuration described herein is just an example.

In an m-th pulse signal output circuit (m≧2) of the shift register described in this embodiment, the fourth input terminal 24 is electrically connected to the first output terminal 26 of an (m−1)-th pulse signal output circuit. In an m-th pulse signal output circuit (m≦n−2); the fifth input terminal 25 is electrically connected to the first output terminal 26 of an (m+2)-th pulse signal output circuit; the first input terminal 26 is electrically connected to the fourth input terminal 24 of an (m+1)-th pulse signal output circuit; and the second output terminal 27 outputs a signal to an OUT(m).

For example, the fourth input terminal 24 in the third pulse signal output circuit $10\_3$ is electrically connected to the first output terminal 26 in the second pulse signal output circuit $10\_2$. The fifth input terminal 25 in the third pulse signal output circuit $10\_3$ is electrically connected to the first output terminal 26 in the fifth pulse signal output circuit $10\_5$. The first input terminal 26 in the third pulse signal output circuit $10\_3$ is electrically connected to the fourth input terminal 24 in the fourth pulse signal output circuit $10\_4$ and the fifth input terminal 25 in the first pulse signal output circuit $10\_1$.

In addition, a first start pulse (SP1) is input from a fifth wiring 15 to the fourth input terminal 24 in the first pulse signal output circuit $10\_1$. A pulse output from the previous stage is input to the fourth input terminal 24 in a k-th pulse signal output circuit $10\_k$ (k is a natural number greater than or equal to 2 and less than or equal to n). A second start pulse (SP2) is input to the fifth input terminal 25 in a (n−1)-th pulse signal output circuit $10\_{n-1}$. A third start pulse (SP3) is input to the fifth input terminal 25 in the n-th pulse signal output circuit $10\_n$. The second start pulse (SP2) and the third start pulse (SP3) may be input from the outside or generated inside the circuit.

Next, specific configurations of the first to n-th pulse signal output circuits $10\_1$ to $10\_n$ will be described.

Figure 1C:
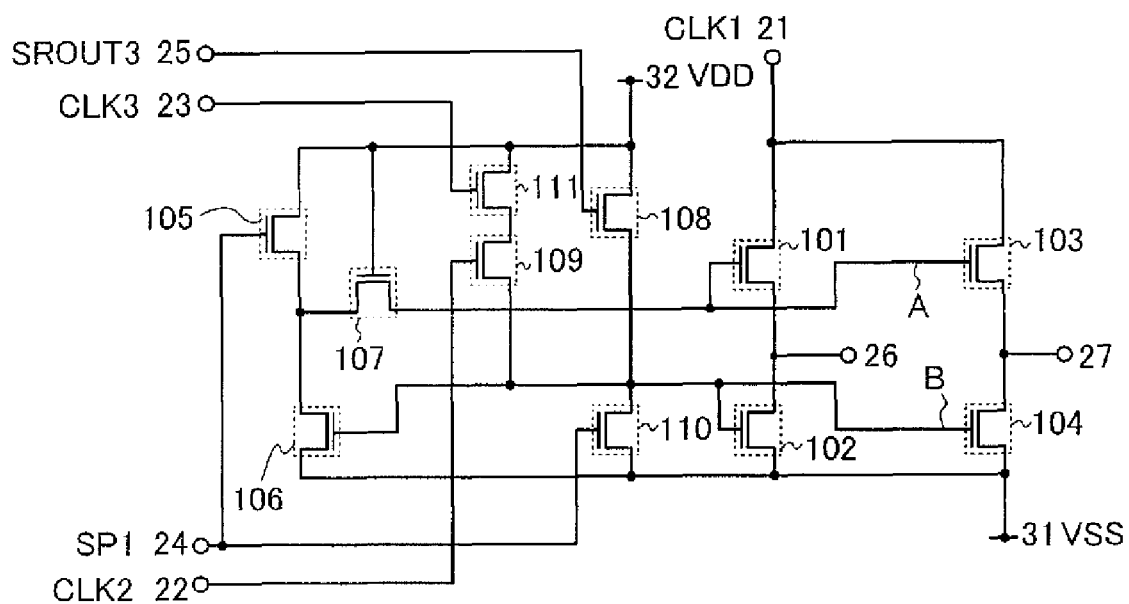
Figure 3A:
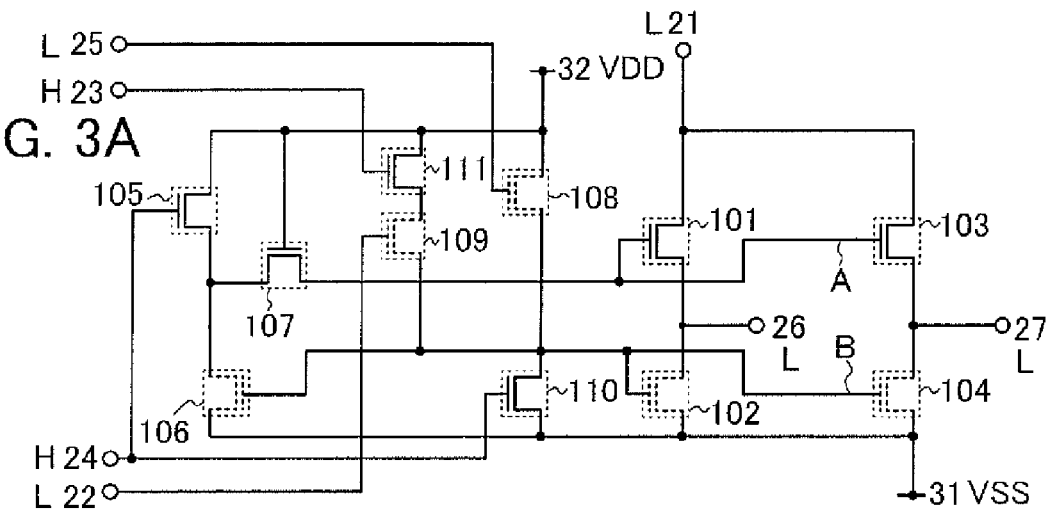
FIGS. 3A to 3C illustrate operation of a pulse signal output circuit.
Figure 3B:
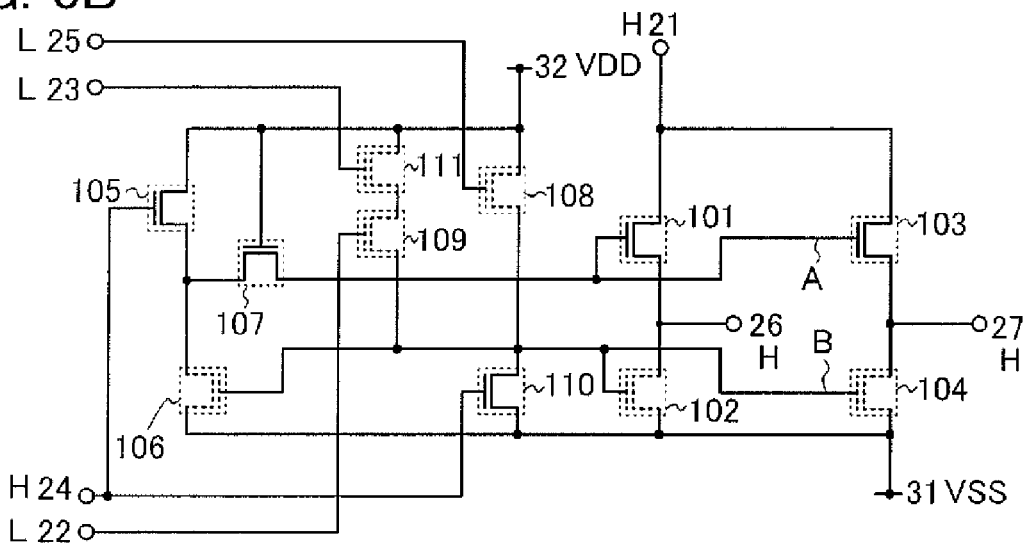
Figure 3C:
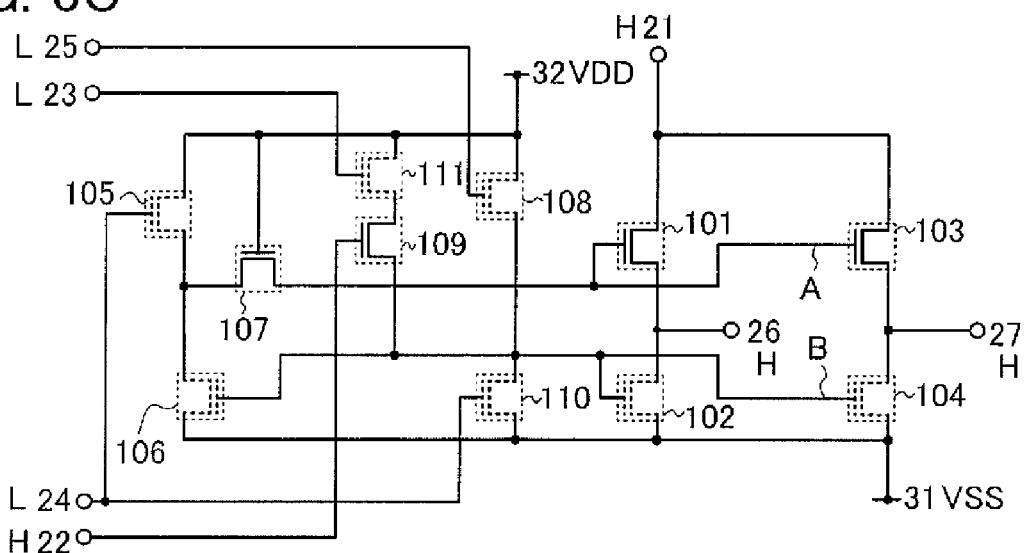
Figure 4A:
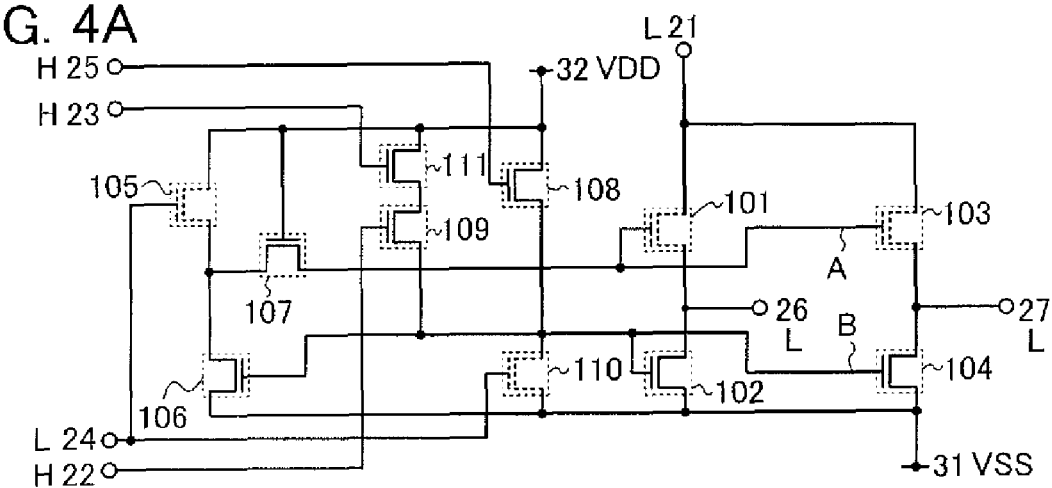
FIGS. 4A to 4C illustrate operation of a pulse signal output circuit.
Figure 4B:
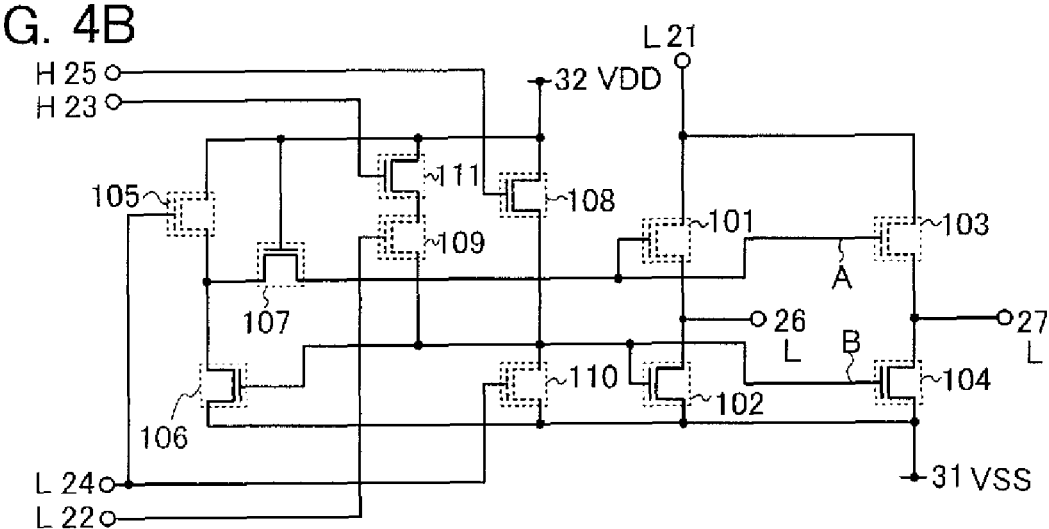
Figure 4C:
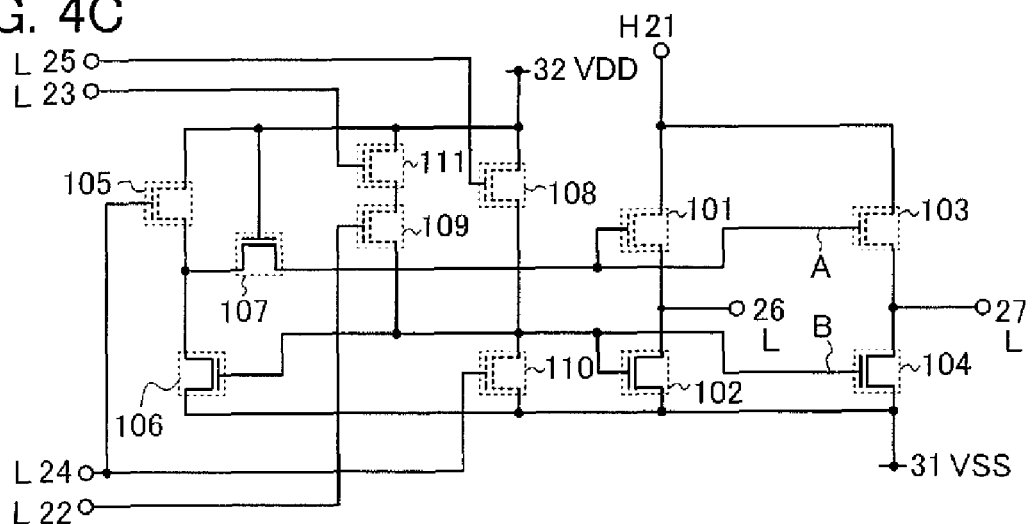

Each of the first to n-th pulse signal output circuits $10\_1$ to $10\_n$ includes a pulse signal generation circuit including first to fourth transistors 101 to 104, a first input signal generation circuit including fifth to seventh transistors 105 to 107, and a second input signal generation circuit including eighth to eleventh transistors 108 to 111 (see FIG. 1C). Further, signals are supplied to the first to eleventh transistors 101 to 111 from first and second power supply lines 31 and 32, in addition to the first to fifth input terminals 21 to 25.

A specific example of a configuration of the pulse signal generation circuit is as follows.

A first terminal (hereinafter, "first terminal" means one of a source terminal and a drain terminal) of the first transistor 101 and a first terminal of the second transistor 102 are electrically connected to the first output terminal 26. Similarly, a first terminal of the third transistor 103 and a first terminal of the fourth transistor 104 are electrically connected to the second output terminal 27. A gate terminal of the first transistor 101, a gate terminal of the third transistor 103, and an output terminal of the first input signal generation circuit are electrically connected to each other. A gate terminal of the second transistor 102, a gate terminal of the fourth transistor 104, and an output terminal of the second input signal generation circuit are electrically connected to each other.

The first clock signal is input to a second terminal (hereinafter, "second terminal" means the other of the source terminal and the drain terminal) of the first transistor 101. The second terminal of the first transistor 101 also functions as the first input terminal 21 in the pulse signal output circuit. A first potential (for example, a low potential $V_{SS}$) is supplied to a second terminal of the second transistor 102 through the first power supply line 31. The first clock signal is input to a second terminal of the third transistor 103. The second terminal of the third transistor 103 also functions as the first input terminal 21 in the pulse signal output circuit. The first potential is supplied to a second terminal of the fourth transistor 104 through the first power supply line 31.

A specific example of a configuration of the first input signal generation circuit is as follows.

A first terminal of the fifth transistor 105, a first terminal of the sixth transistor 106, and a first terminal of the seventh transistor 107 are electrically connected to each other. Further, a second terminal of the seventh transistor 107 functions as the output terminal of the first input signal generation circuit.

A second potential is supplied to a second terminal of the fifth transistor 105 through the second power supply line 32. The first potential is supplied to a second terminal of the sixth transistor 106 through the first power supply line 31. A pulse signal from the previous stage (in the first pulse signal output circuit, the pulse signal includes a start pulse signal) is input to a gate terminal of the fifth transistor 105. The gate terminal of the fifth transistor 105 functions as a first input terminal of the first input signal generation circuit and functions as the fourth input terminal 24 of the pulse signal output circuit. An output signal of the second input signal generation circuit is input to a gate terminal of the sixth transistor 106. The gate terminal of the sixth transistor 106 functions as a second input terminal of the first input signal generation circuit. The second potential is supplied to a gate terminal of the seventh transistor 107 through the second power supply line 32.

Although the seventh transistor 107 is provided in this embodiment, a configuration without the seventh transistor 107 may be employed. With the seventh transistor 107, rise in the potential of the first terminal of the fifth transistor 105, which might be caused by bootstrap operation, can be suppressed. That is to say, application of high bias voltage to a region between a gate and a source (or between the gate and a drain) of the fifth transistor 105 can be prevented; thus, deterioration of the fifth transistor 105 can be suppressed.

A specific example of a configuration of the second input signal generation circuit is as follows.

A second terminal of the eleventh transistor 111 and a first terminal of the ninth transistor 109 are electrically connected to each other. A second terminal of the ninth transistor, a second terminal of the eighth transistor, and a first terminal of the tenth transistor are electrically connected to each other and function as the output terminal of the second input signal generation circuit.

The second potential is supplied to a first terminal of the eighth transistor 108 and a first terminal of the eleventh transistor 111 through the second power supply line 32. The first potential is supplied to a second terminal of the tenth transistor 110 through the first power supply line 31. A pulse signal from a second subsequent stage is input to a gate terminal of the eighth transistor 108, as illustrated in FIG. 1A and FIG. 1B. The gate terminal of the eighth transistor 108 functions as a first input terminal of the second input signal generation circuit and as the fifth input terminal 25 in the pulse signal output circuit. The second clock signal is input to a gate terminal of the ninth transistor 109. The gate terminal of the ninth transistor 109 functions as a second input terminal of the second input signal generation circuit and the second input terminal 22 in the pulse signal output circuit. A pulse signal from the previous stage (in the first pulse signal output circuit, the pulse signal is a start pulse signal) is input to a gate terminal of the tenth transistor 110. The gate terminal of the tenth transistor 110 functions as a third input terminal of the second input signal generation circuit and the fourth input terminal 24 in the pulse signal output circuit. The third clock signal is input to a gate terminal of the eleventh transistor 111. The gate terminal of the eleventh transistor 111 functions as a fourth input terminal of the second input signal generation circuit and the third input terminal 23 in the pulse signal output circuit.

Note that in the pulse signal output circuit described in this embodiment, a channel length of the sixth transistor 106 is longer than a channel length of the third transistor 103 and longer than a channel length of the fourth transistor 104. Further, a channel length of the tenth transistor 110 is longer than the channel length of the third transistor 103 and longer than the channel length of the fourth transistor 104. Thus, the amount of shifts in the threshold voltage of the sixth transistor 106 and the tenth transistor 110 can be reduced, so that the deterioration can be suppressed.

Note that components of the pulse signal output circuit (e.g., configuration examples of the pulse signal generation circuit, the first input signal generation circuit, and the second input signal generation circuit) are just examples, and the disclosed invention is not limited thereto.

In the following description of this embodiment, a node where the gate terminal of the first transistor 101, the gate terminal of the third transistor 103, and the output terminal of the first input signal generation circuit are connected to each other in the pulse signal output circuit illustrated in FIG. 1C is referred to as a node A. In addition, a node where the gate terminal of the second transistor 102, the gate terminal of the fourth transistor 104, and the output terminal of the second input signal generation circuit are connected to each other is referred to as a node B.

A capacitor for favorably performing bootstrap operation may be provided between the node A and the first output terminal 26. Furthermore, a capacitor electrically connected to the node B may be provided in order to hold a potential of the node B.

Note that each of the first to eleventh transistors 101 to 111 preferably includes an oxide semiconductor. When an oxide semiconductor is included in the transistor, the off-state current of the transistor can be reduced. Further, the on-state current and field-effect mobility of the transistor including an oxide semiconductor can be increased as compared to a transistor including amorphous silicon or the like. Furthermore, the deterioration of the transistor can be suppressed. Thus, an electronic circuit which consumes low power, can operate at high speed, and operates with higher accuracy is realized. Note that the description of the transistor including an oxide semiconductor is omitted here because it is described in detail in an embodiment below.

<Operation>

Next, operation of the shift register shown in FIGS. 1A to 1C is described with reference to FIG. 2, FIGS. 3A to 3C, and FIGS. 4A to 4C. Specifically, operation in each of first to sixth periods 51 to 56 in a timing chart illustrated in FIG. 2 is described with reference to FIGS. 3A to 3C and FIGS. 4A to 4C. In the timing chart, CLK1 to CLK4 denote clock signals; SP1 denotes a first start pulse; OUT1 to OUT4 denote outputs from the second output terminals of the first to fourth pulse signal output circuits $10\_1$ to $10\_4$; nodes A and B denote potentials at the nodes A and B; and SROUT1 to SROUT4 denote outputs from the first output terminals of the first to fourth pulse signal output circuits $10\_1$ to $10\_4$.

Note that in the description below, the first to eleventh transistors 101 to 111 are all n-channel transistors. Further, in FIGS. 3A to 3C and FIGS. 4A to 4C, transistors indicated by solid lines mean that the transistors are in a conduction state (on), and transistors indicated by dashed lines mean that the transistors are in a non-conduction state (off).

Typical operation of the first pulse signal output circuit $10_{-1}$ is described. The configuration of the first pulse signal output circuit $10_{-1}$ is as described above. Further, relation between signals input and potentials supplied is as described above. Note that in the description below, $V_{DD}$ is used for all the high potentials (also referred to as H levels, H-level signals, or the like) to be supplied to input terminals and power supply lines, and $V_{SS}$ is used for all the low potentials (also referred to as L levels, L-level signals, or the like) to be supplied to input terminals and power supply lines.

In the first period 51, SP1 is at H level, so that a high potential is supplied to the gate terminal of the fifth transistor 105 and the gate terminal of the tenth transistor 110 which function as the fourth input terminal 24 in the first pulse signal output circuit $10_{-1}$. Thus, the fifth transistor 105 and the tenth transistor 110 are turned on. In the first period 51, CLK3 is also at H level, so that the eleventh transistor 111 is also turned on. In addition, since a high potential is supplied to the gate terminal of the seventh transistor 107, the seventh transistor 107 is also turned on (see FIG. 3A).

When the fifth transistor 105 and the seventh transistor 107 are turned on, the potential of the node A rises. When the tenth transistor 110 is turned on, the potential of the node B falls. The potential of the second terminal of the fifth transistor 105 is $V_{DD}$. Therefore, the potential of the first terminal of the fifth transistor 105 becomes $V_{DD}-V_{th105}$, which is a potential obtained by subtracting the threshold voltage of the fifth transistor 105 from the potential of the second terminal. The potential of the gate terminal of the seventh transistor 107 is $V_{DD}$. Therefore, in the case where $V_{th107}$, which is the threshold voltage of the seventh transistor 107, is higher than or equal to $V_{th105}$, the potential of the node A becomes $V_{DD}-V_{th107}$, whereby the seventh transistor 107 is turned off. On the other hand, in the case where $V_{th107}$ is lower than $V_{th105}$, the potential of the node A rises to $V_{DD}-V_{th105}$ while the seventh transistor 107 is kept on. Hereinafter, the potential of the node A attained in the first period 51 is denoted by $V_{AH}$. Here, $V_{th105}$ and $V_{th107}$ are the threshold voltage of the fifth transistor 105 and the threshold voltage of the seventh transistor 107, respectively. The same can be said for the other transistors. When the potential of the node A reaches $V_{AH}$, the fifth transistor 105 and the seventh transistor 107 are turned off; thus, the node A is made to be in a floating state while the potential thereof is kept at $V_{AH}$.

When the potential of the node A becomes $V_{AH}$, the first transistor 101 and the third transistor 103 are turned on. Here, since CLK1 is at L level, an L-level signal is output from the first output terminal 26 and the second output terminal 27.

In the second period 52, the potential of CLK1 is changed from L level to H level. Since the first transistor 101 and the third transistor 103 are on, a potential of the first output terminal 26 and a potential of the second output terminal 27 rise. Further, a capacitance is generated between the gate terminal and the source terminal (or the drain terminal) of the first transistor 101; with the capacitance, the gate terminal and the source terminal (or the drain terminal) thereof are capacitively coupled. Similarly, a capacitance is generated between the gate terminal and the source terminal (or the drain terminal) of the third transistor 103; with the capacitance, the gate terminal and the source terminal (or the drain terminal) thereof are capacitively coupled. Thus, the potential of the node A in a floating state rises as the potential of the first output terminal 26 and the potential of the second output terminal 27 rise (bootstrap operation). The potential of the node A finally becomes higher than $V_{DD}+V_{th101}$, and each of the potential of the first output terminal 26 and the potential of the second output terminal 27 becomes $V_{DD}$ (H level) (see FIG. 2 and FIG. 3B).

In the second period 52, the tenth transistor 110 is on; therefore, the node B is kept at L level. Thus, variation in the potential of the node B due to capacitive coupling, which occurs when the potential of the first output terminal 26 is changed from L level to H level, can be suppressed, so that a malfunction due to the variation in the potential can be prevented.

In the third period 53, SP1 becomes L level, so that the fifth transistor 105 and the tenth transistor 110 are turned off. Further, CLK1 is kept at H level and the potential of the node A is not changed; thus, $V_{DD}$ (a H-level signal) is output from the first output terminal 26 and the second output terminal 27 (see FIG. 3C). Note that in the third period 53, although the node B is in a floating state, the potential of the first output terminal 26 is not changed; therefore, a malfunction due to the capacitive coupling is negligible.

In the fourth period 54, since both CLK2 and CLK3 are at H level, the potential of the node B rises in a short period of time. Further, CLK1 becomes L level. Consequently, the second transistor 102 and the fourth transistor 104 are turned on, so that the potentials of the first output terminal 26 and the second output terminal 27 fall in a short period of time (see FIG. 4A).

In the fifth period 55, the potential of the fifth input terminal 25 (i.e., SROUT3) is kept at H level, whereby the potential of the node B is kept. Thus, the second transistor 102, the fourth transistor 104, and the sixth transistor 106 are kept on, so that the potentials of the first output terminal 26 and the second output terminal 27 are kept at L level (see FIG. 4B).

In the sixth period 56, the fifth input terminal 25 (i.e., SROUT3) becomes L level, so that the eighth transistor 108 is turned off. At this time, the node B is made to be in a floating state while keeping the potential. Thus, the second transistor 102, the fourth transistor 104, and the sixth transistor 106 are kept on (see FIG. 4C).

Note that the potential of the node B falls due to an off-state current of a transistor, for example. However, a transistor with a sufficiently low off-state current (e.g., a transistor including an oxide semiconductor) does not have such a problem; thus, the fall in the potential of the node B can be suppressed.

The threshold voltage of a transistor including silicon is controlled by doping, but the threshold voltage of a transistor including a wide-gap semiconductor such as an oxide semiconductor cannot be controlled by doping. Thus, in the transistor including a wide-gap semiconductor, a current might flow between a source and a drain even when a bias is not applied to a gate (even when the gate and the source have the same potential). However, in the pulse signal output circuit described in this embodiment, the channel length of the tenth transistor 110 is made longer than the channel length of the third transistor 103 and longer than the channel length of the fourth transistor 104, whereby the amount of a leakage current generated from the node B can be suppressed; thus, the potential of the node B can be kept stably. Further, the channel length of the sixth transistor 106 is made longer than the channel length of the third transistor 103 and longer than the channel length of the fourth transistor 104, whereby the amount of a leakage current generated from the node A can be suppressed; thus, bootstrap operation in the node A can be made stable. That is to say, with the structure of this embodiment, the potential of the node A and the potential of the node B can be kept for a long period of time; thus, even when the structure is used for a circuit with low frequency, for example, a malfunction can be prevented.

Figure 5A:
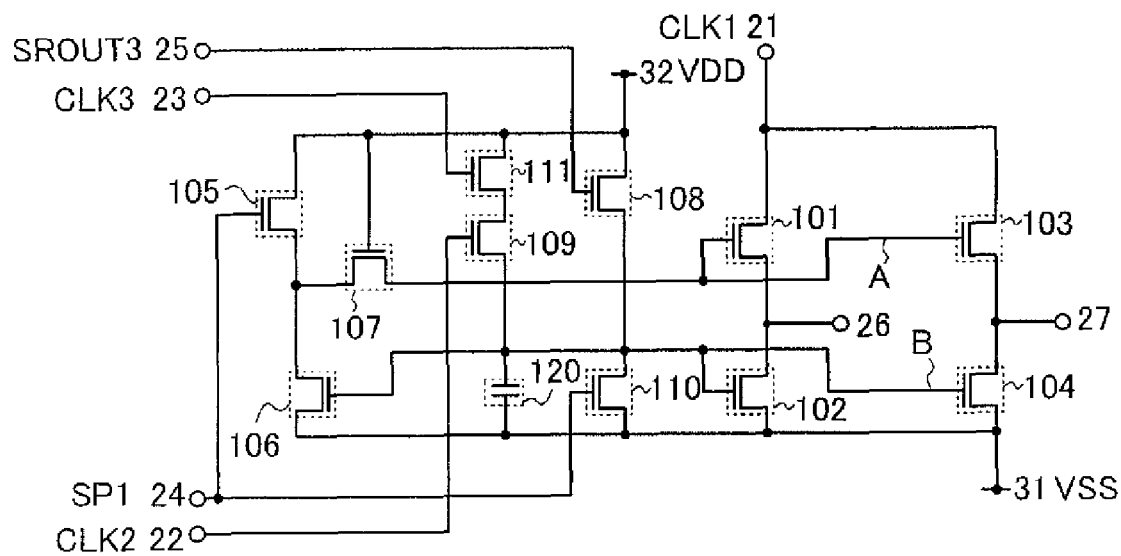
FIGS. 5A and 5B illustrate configuration examples of a pulse signal output circuit.

Note that in order to further suppress the fall in the potential of the node B, a capacitor 120 having one electrode electrically connected to the node B may be additionally provided, as illustrated in FIG. 5A. The other electrode of the capacitor 120 may be electrically connected to the first power supply line 31, for example.

Figure 5B:
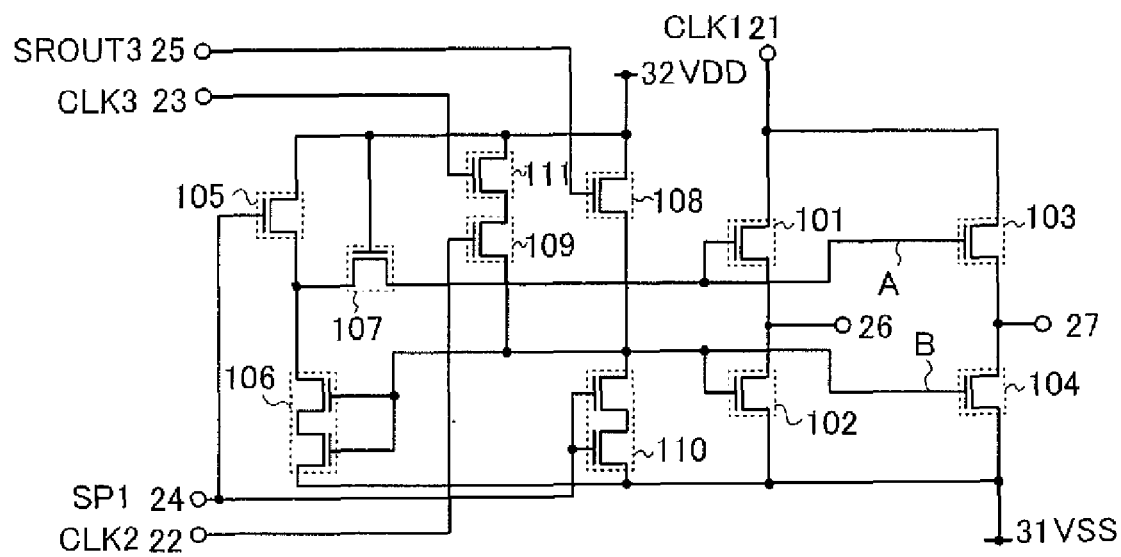

Further, the fall in the potential of the node B can be further suppressed by using a sixth transistor 106 or a tenth transistor 110 having a multi-gate structure where at least two gates are arranged in series, as illustrated in FIG. 5B. Note that although FIG. 5B illustrates an example in which both the sixth transistor 106 and the tenth transistor 110 have multi-gate structures, only one of the sixth transistor 106 and the tenth transistor 110 may have a multi-gate structure. Of course, the structure illustrated in FIG. 5A and the structure illustrated in FIG. 5B may be used in combination.

With the use of a transistor having a multi-gate structure as illustrated in FIG. 5B, redundancy of the transistor can be accomplished. Thus, yield of the pulse signal output circuit can be improved.

In the case where both CLK2 and CLK3 become H level in a subsequent period, the ninth transistor 109 and the eleventh transistor 111 are turned on, and a potential is supplied to the node B periodically. Therefore, even when a transistor having a comparatively high off-state current is used, a malfunction of the pulse signal output circuit can be prevented.

In addition, the shift register of this embodiment is driven by a driving method in which a pulse output from the m-th pulse signal output circuit overlaps with half of a pulse output from the (m+1)-th pulse signal output circuit. Therefore, a wiring can be charged for a longer period of time as compared to the case where the driving method is not used. That is to say, with the driving method, a pulse signal output circuit which withstands a heavy load and operates at high frequency is provided.

(Embodiment 2)

In this embodiment, configuration examples of a pulse signal output circuit and a shift register including the pulse signal output circuit, which are different modes from the pulse signal output circuit and the shift register described in the above embodiment, and operation thereof will be described with reference to FIGS. 6A to 6C, FIG. 7, FIGS. 8A to 8C, and FIGS. 9A and 9B.

<Circuit Configuration>

First, examples of circuit configurations of a pulse signal output circuit and a shift register including the pulse signal output circuit will be described with reference to FIGS. 6A to 6C.

The configuration of the shift register described in this embodiment is similar to that of the shift register described in the above embodiment. One of differences between them is that the third input terminal 23 is not provided in the first to n-th pulse signal output circuits 10_1 to 10_n (see FIGS. 6A to 6C). That is, two types of clock signals are input to one pulse signal output circuit. The other structures are similar to those in the above embodiment.

Figure 6A:
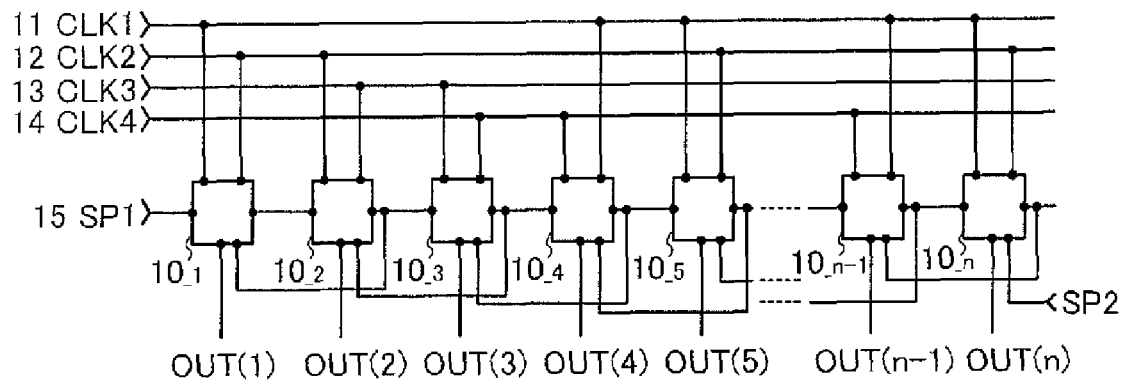
FIGS. 6A to 6C illustrate configuration examples of a pulse signal output circuit and a shift register.
Figure 6B:
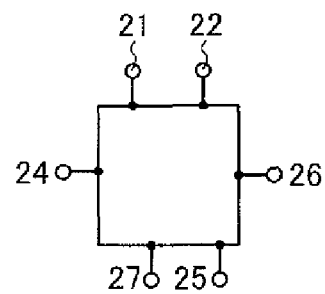
Figure 6C:
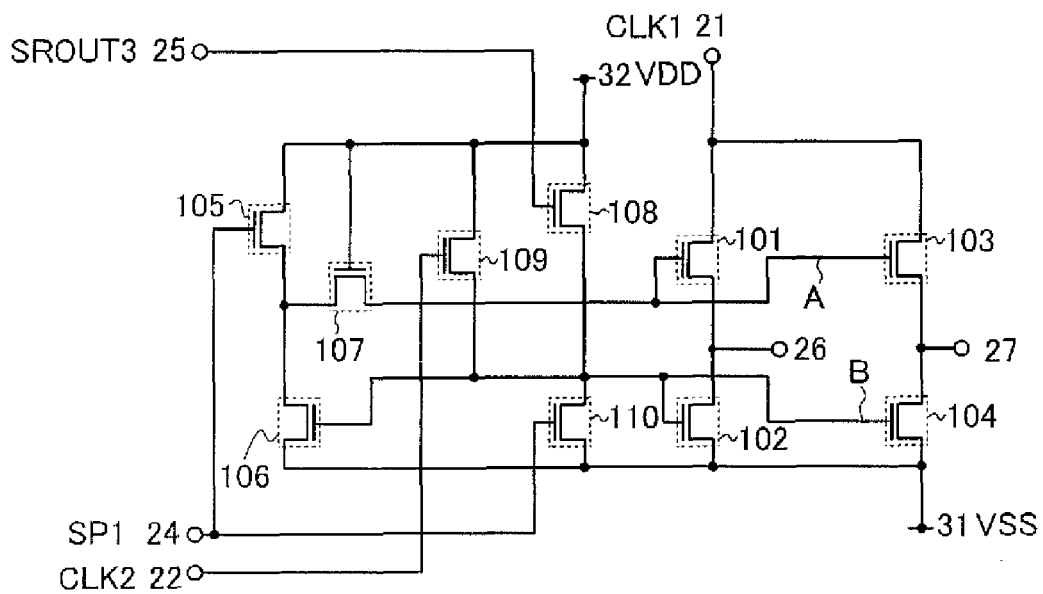

Since the third input terminal 23 is not provided in the first to n-th pulse signal output circuits 10_1 to 10_n, the eleventh transistor connected to the third input terminal 23 is not provided (see FIG. 6C). Accordingly, the connection relation in the second input signal generation circuit is partly changed.

A specific example of a configuration of the second input signal generation circuit is as follows.

The second terminal of the ninth transistor 109, the second terminal of the eighth transistor 108, and the first terminal of the tenth transistor 110 are electrically connected to each other and function as the output terminal of the second input signal generation circuit.

The second potential is supplied to the first terminal of the eighth transistor 108 and the first terminal of the ninth transistor 109 through the second power supply line 32. The first potential is supplied to the second terminal of the tenth transistor 110 through the first power supply line 31. A pulse signal is input to the gate terminal of the eighth transistor 108. The gate terminal of the eighth transistor 108 functions as the first input terminal of the second input signal generation circuit and as the fifth input terminal 25 in the pulse signal output circuit. The second clock signal is input to the gate terminal of the ninth transistor 109. The gate terminal of the ninth transistor 109 functions as the second input terminal of the second input signal generation circuit and the second input terminal 22 in the pulse signal output circuit. A pulse signal is input to the gate terminal of the tenth transistor 110. The gate terminal of the tenth transistor 110 functions as the third input terminal of the second input signal generation circuit and the fourth input terminal 24 in the pulse signal output circuit.

Note that in the pulse signal output circuit described in this embodiment, a channel length of the sixth transistor 106 is longer than a channel length of the third transistor 103 and longer than a channel length of the fourth transistor 104. Further, a channel length of the tenth transistor 110 is longer than the channel length of the third transistor 103 and longer than the channel length of the fourth transistor 104. Thus, the amount of shifts in the threshold voltage of the sixth transistor 106 and the tenth transistor 110 can be reduced, so that the deterioration can be suppressed.

Note that the aforementioned configuration is just an example, and the disclosed invention is not limited thereto.

In the following description of this embodiment, in a manner similar to the above embodiment, a node where the gate terminal of the first transistor 101, the gate terminal of the third transistor 103, and the output terminal of the first input signal generation circuit are connected to each other in the pulse signal output circuit illustrated in FIG. 6C is referred to as a node A. In addition, a node where the gate terminal of the second transistor 102, the gate terminal of the fourth transistor 104, and the output terminal of the second input signal generation circuit are connected to each other is referred to as a node B.

A capacitor for favorably performing bootstrap operation may be provided between the node A and the first output terminal 26. Furthermore, a capacitor electrically connected to the node B may be provided in order to hold a potential of the node B.

Note that each of the first to tenth transistors 101 to 110 preferably includes an oxide semiconductor. When an oxide semiconductor is included in the transistor, the off-state current of the transistor can be reduced. Further, the on-state current and field-effect mobility of the transistor including an oxide semiconductor can be increased as compared to a transistor including amorphous silicon or the like. Furthermore, the deterioration of the transistor can be suppressed. Thus, an electronic circuit which consumes low power, can operate at high speed, and operates with higher accuracy is realized. Note that the description of the transistor including an oxide semiconductor is omitted here because it is described in detail in an embodiment below.

<Operation>

Figure 7:
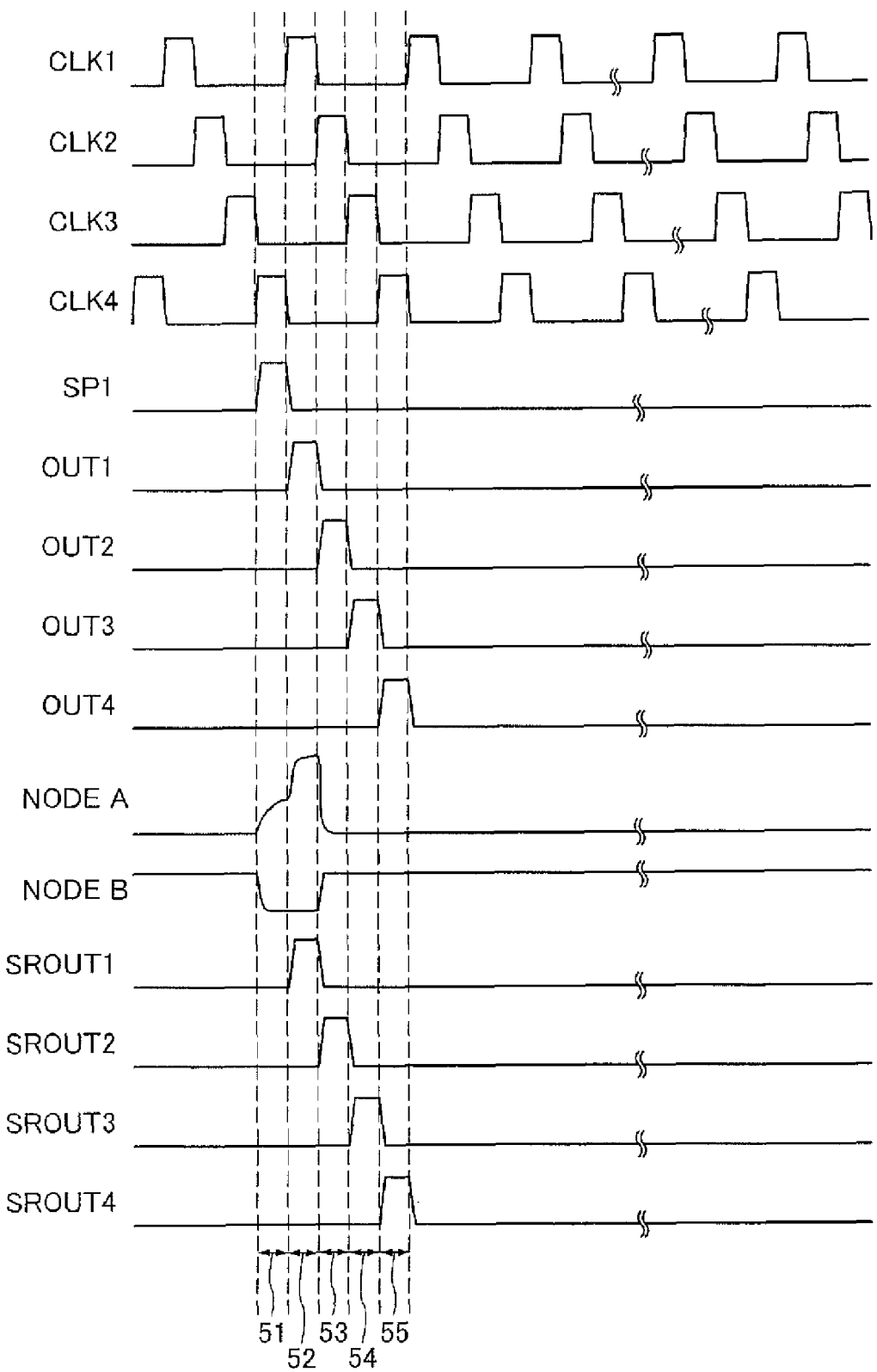
FIG. 7 is a timing chart of a shift register.
Figure 8A:
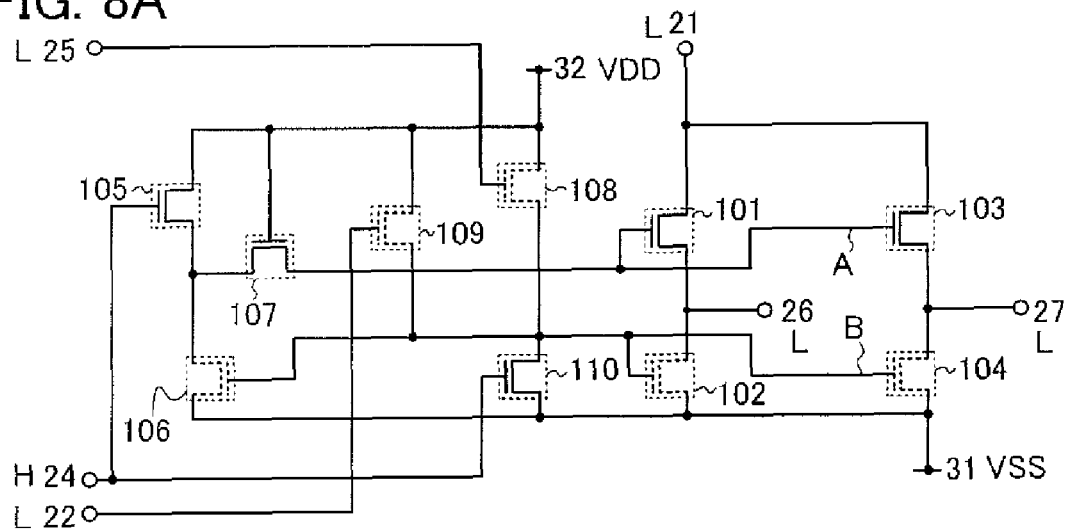
FIGS. 8A to 8C illustrate operation of a pulse signal output circuit.
Figure 8B:
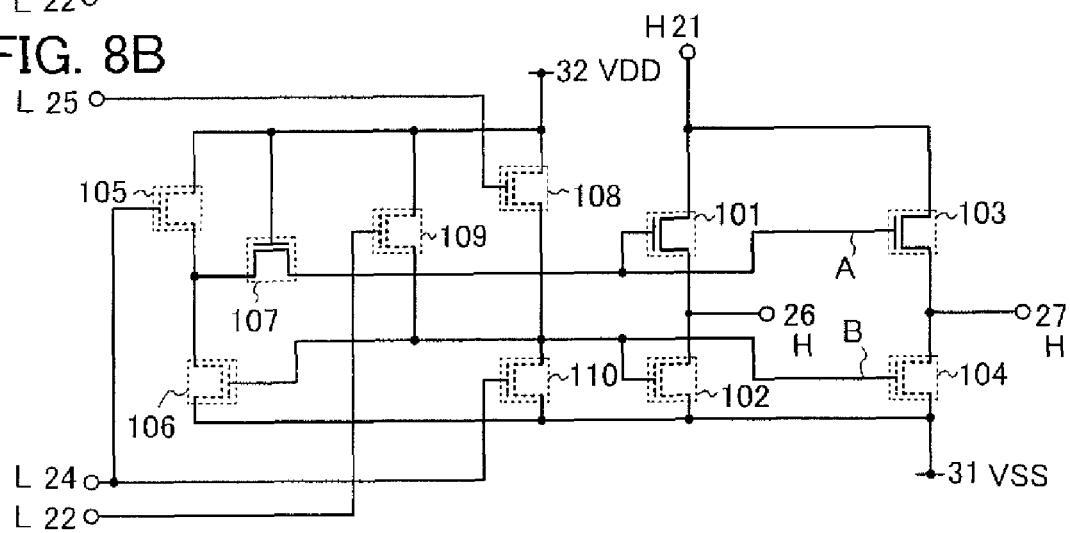
Figure 8C:
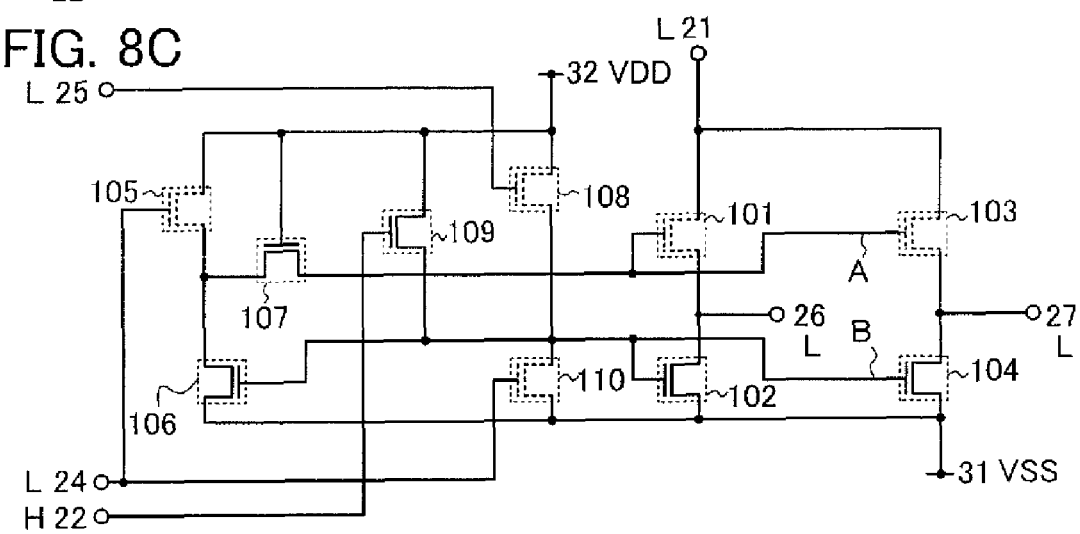
Figure 9A:
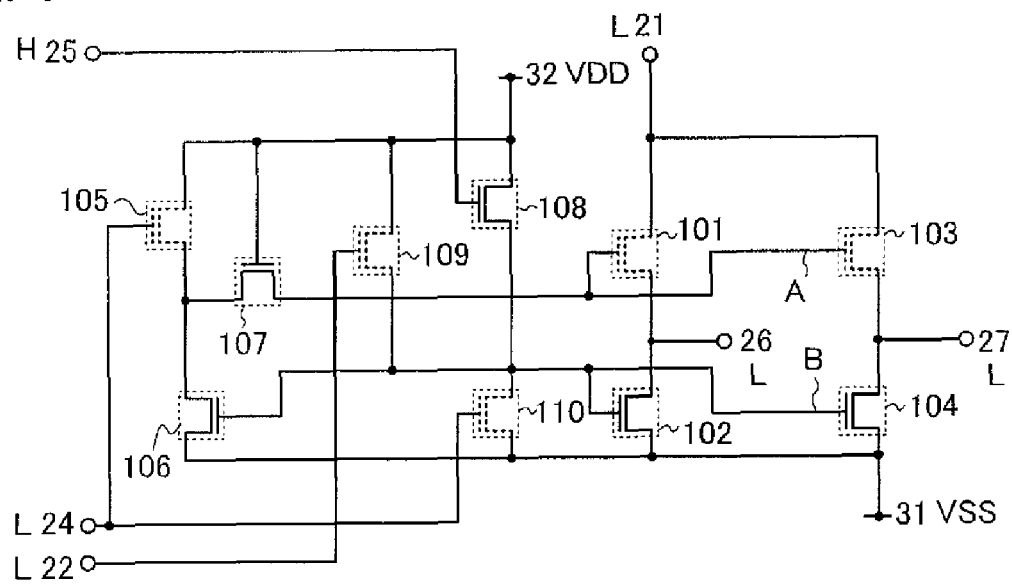
FIGS. 9A and 9B illustrate operation of a pulse signal output circuit.
Figure 9B:
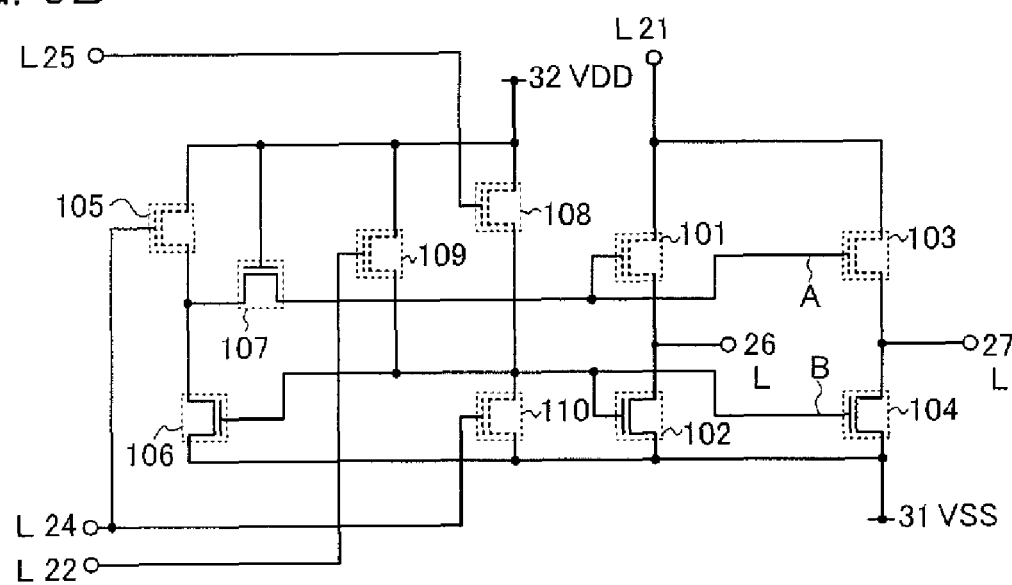

Next, operation of the shift register shown in FIGS. 6A to 6C is described with reference to FIG. 7, FIGS. 8A to 8C, and FIGS. 9A and 9B. Specifically, operation in each of first to fifth periods 51 to 55 in a timing chart illustrated in FIG. 7 is described with reference to FIGS. 8A to 8C and FIGS. 9A and 9B. In the timing chart, CLK1 to CLK4 denote clock signals; SP1 denotes a first start pulse; OUT1 to OUT4 denote outputs from the second output terminals of the first to fourth pulse signal output circuits $10\_1$ to $10\_4$; nodes A and B denote potentials at the nodes A and B; and SROUT1 to SROUT4 denote outputs from the first output terminals of the first to fourth pulse signal output circuits $10\_1$, to $10\_4$.

Note that in the description below, the first to tenth transistors 101 to 110 are all n-channel transistors. Further, in FIGS. 8A to 8C and FIGS. 9A and 9B, transistors indicated by solid lines mean that the transistors are in a conduction state (on), and transistors indicated by dashed lines mean that the transistors are in a non-conduction state (off).

Typical operation of the first pulse signal output circuit $10\_1$ is described. The configuration of the first pulse signal output circuit $10\_1$ is as described above. Further, relation between signals input and potentials supplied is as described above. Note that in the description below, $V_{DD}$ is used for all the high potentials (also referred to as H levels, H-level signals, or the like) to be supplied to input terminals and power supply lines, and $V_{SS}$ is used for all the low potentials (also referred to as L levels, L-level signals, or the like) to be supplied to input terminals and power supply lines.

In the first period 51, SP1 is at H level, so that a high potential is supplied to the gate terminal of the fifth transistor 105 and the gate terminal of the tenth transistor 110 which function as the fourth input terminal 24 in the first pulse signal output circuit $10\_1$. Thus, the fifth transistor 105 and the tenth transistor 110 are turned on. In addition, since a high potential is supplied to the gate terminal of the seventh transistor 107, the seventh transistor 107 is also turned on (see FIG. 8A).

When the fifth transistor 105 and the seventh transistor 107 are turned on, the potential of the node A rises. When the tenth transistor 110 is turned on, the potential of the node B falls. The potential of the second terminal of the fifth transistor 105 is $V_{DD}$. Therefore, the potential of the first terminal of the fifth transistor 105 becomes $V_{DD}-V_{th105}$, which is a potential obtained by subtracting the threshold voltage of the fifth transistor 105 from the potential of the second terminal. The potential of the gate terminal of the seventh transistor 107 is $V_{DD}$. Therefore, in the case where $V_{th107}$, which is the threshold voltage of the seventh transistor 107, is higher than or equal to $V_{th105}$, the potential of the node A becomes $V_{DD}-V_{th107}$, whereby the seventh transistor 107 is turned off. On the other hand, in the case where $V_{th107}$ is lower than $V_{th105}$, the potential of the node A rises to $V_{DD}-V_{th105}$ while the seventh transistor 107 is kept on. Hereinafter, the potential of the node A attained in the first period 51 is denoted by $V_{AH}$. When the potential of the node A reaches $V_{AH}$, the fifth transistor 105 and the seventh transistor 107 are turned off; thus, the node A is made to be in a floating state while the potential thereof is kept at $V_{AH}$.

When the potential of the node A becomes $V_{AH}$, the first transistor 101 and the third transistor 103 are turned on. Here, since CLK1 is at L level, an L-level signal is output from the first output terminal 26 and the second output terminal 27.

In the second period 52, the potential of CLK1 is changed from L level to H level. Since the first transistor 101 and the third transistor 103 are on, a potential of the first output terminal 26 and a potential of the second output terminal 27 rise. Further, a capacitance is generated between the gate terminal and the source terminal (or the drain terminal) of the first transistor 101; with the capacitance, the gate terminal and the source terminal (or the drain terminal) thereof are capacitively coupled. Similarly, a capacitance is generated between the gate terminal and the source terminal (or the drain terminal) of the third transistor 103; with the capacitance, the gate terminal and the source terminal (or the drain terminal) thereof are capacitively coupled. Thus, the potential of the node A in a floating state rises as the potential of the first output terminal 26 and the potential of the second output terminal 27 rise (bootstrap operation). The potential of the node A finally becomes higher than $V_{DD}-V_{th101}$, and each of the potential of the first output terminal 26 and the potential of the second output terminal 27 becomes $V_{DD}$ (H level) (see FIG. 7 and FIG. 8B).

In the third period 53, CLK2 becomes H level, and the ninth transistor 109 is turned on. Accordingly, the potential of the node B rises. When the potential of the node B rises, the second transistor 102, the fourth transistor 104, and the sixth transistor 106 are turned on and the potential of the node A falls. Therefore, the potential of the first output terminal 26 and the potential of the second output terminal 27 become L level (see FIG. 8C).

In the fourth period 54, CLK2 becomes L level, and the ninth transistor 109 is turned off. The fifth input terminal 25 (i.e., SROUT3) becomes H level, and the eighth transistor 108 is turned on. Therefore, the potential of the node A and the potential of the node B are kept, and the potential of the first output terminal 26 and the potential of the second output terminal 27 are kept at L level (see FIG. 9A).

In the fifth period 55, the potential of the fifth input terminal 25 (i.e., SROUT3) becomes L level, whereby the potential of the node B is kept. Thus, the second transistor 102, the fourth transistor 104, and the sixth transistor 106 are kept on, so that the potentials of the first output terminal 26 and the second output terminal 27 are kept at L level (see FIG. 9B).

Note that the potential of the node B falls due to an off-state current of a transistor, for example. However, a transistor with a sufficiently low off-state current (e.g., a transistor including an oxide semiconductor) does not have such a problem.

The threshold voltage of a transistor including silicon is controlled by doping, but the threshold voltage of a transistor including a wide-gap semiconductor such as an oxide semiconductor cannot be controlled by doping. Thus, in the transistor including a wide-gap semiconductor, a current might flow between a source and a drain even when a bias is not applied to a gate (even when the gate and the source have the same potential). However, in the pulse signal output circuit described in this embodiment, the channel length of the tenth transistor 110 is made longer than the channel length of the third transistor 103 and longer than the channel length of the fourth transistor 104, whereby the amount of a leakage current generated from the node B can be suppressed; thus, the potential of the node B can be kept stably. Further, the channel length of the sixth transistor 106 is made longer than the channel length of the third transistor 103 and longer than the channel length of the fourth transistor 104, whereby the amount of a leakage current generated from the node A can be suppressed; thus, bootstrap operation in the node A can be made stable. That is to say, with the structure of this embodiment, the potential of the node A and the potential of the node B can be kept for a long period of time; thus, even when the structure is used for a circuit with low frequency, for example, a malfunction can be prevented.

Figure 10A:
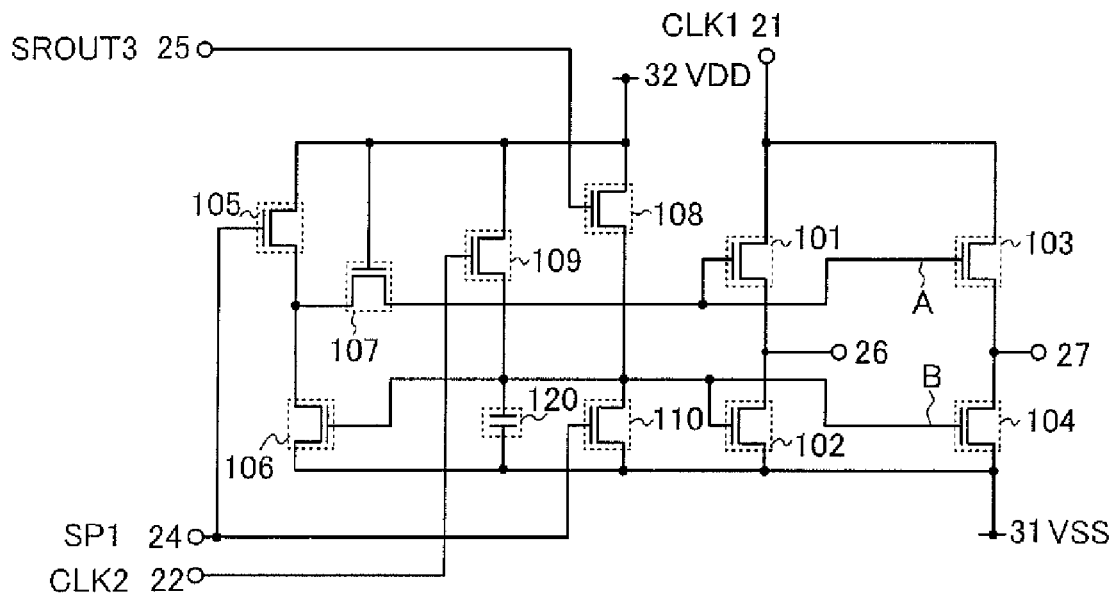
FIGS. 10A and 10B illustrate configuration examples of a pulse signal output circuit.

Note that in order to further suppress the fall in the potential of the node B, a capacitor 120 having one electrode electrically connected to the node B may be additionally provided, as illustrated in FIG. 10A. The other electrode of the capacitor 120 may be electrically connected to the first power supply line 31, for example.

Figure 10B:
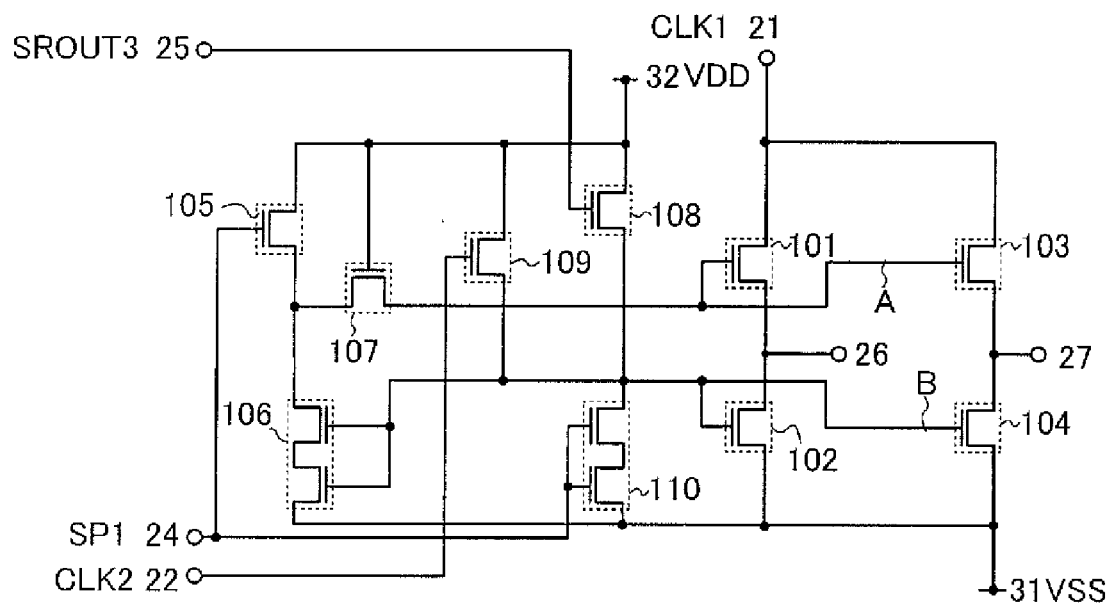

Further, the fall in the potential of the node B can be further suppressed by using a sixth transistor 106 or a tenth transistor 110 having a multi-gate structure where at least two gates are arranged in series, as illustrated in FIG. 10B. Note that although FIG. 10B illustrates an example in which both the sixth transistor 106 and the tenth transistor 110 have multi-gate structures, one of the sixth transistor 106 and the tenth transistor 110 may have a multi-gate structure. Of course, the structure illustrated in FIG. 10A and the structure illustrated in FIG. 10B may be used in combination.

With the use of a transistor having a multi-gate structure as illustrated in FIG. 10B, redundancy of the transistor can be accomplished. Thus, yield of the pulse signal output circuit can be improved.

In the case where CLK2 becomes H level in a subsequent period, the ninth transistor 109 is turned on, and a potential is supplied to the node B periodically. Therefore, even when a transistor having a comparatively high off-state current is used, a malfunction of the pulse signal output circuit can be prevented.

As described above, the structures, methods, and the like described in this embodiment can be combined with any of the structures, methods, and the like described in the other embodiments as appropriate.

(Embodiment 3)

In this embodiment, examples of transistors which can be used in the pulse signal output circuit and the shift register described in the above embodiment are described with reference to FIGS. 11A to 11D. There is no particular limitation on the structure of the transistor. For example, a suitable structure such as a top-gate structure, a bottom-gate structure, a staggered structure, or a planar structure can be employed. Alternatively, the transistor may have a single-gate structure in which one channel formation region is formed or a multi-gate structure in which two or more channel formation regions are formed. Alternatively, the transistor may have a structure in which two gate electrode layers are formed over and below a channel region with a gate insulating layer provided therebetween.

FIGS. 11A to 11D illustrate examples of the cross-sectional structures of the transistors. The transistors illustrated in FIGS. 11A to 11D each include an oxide semiconductor as a semiconductor. An advantage of the use of an oxide semiconductor is high mobility and low off-state current which can be obtained by a simple low-temperature process.

Figure 11A:
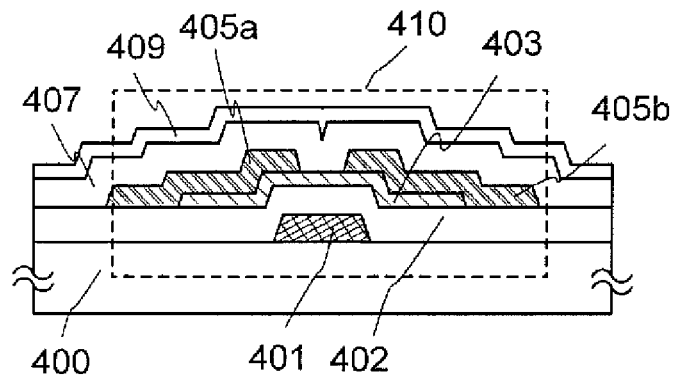
FIGS. 11A to 11D illustrate structure examples of transistors.

A transistor 410 illustrated in FIG. 11A is an example of a bottom-gate transistor and is also referred to as an inverted-staggered transistor.

The transistor 410 includes a gate electrode layer 401, a gate insulating layer 402, an oxide semiconductor layer 403, a source electrode layer 405a, and a drain electrode layer 405b which are provided over a substrate 400 having an insulating surface. Further, an insulating layer 407 which is in contact with the oxide semiconductor layer 403 is provided. A protective insulating layer 409 is formed over the insulating layer 407.

Figure 11B:
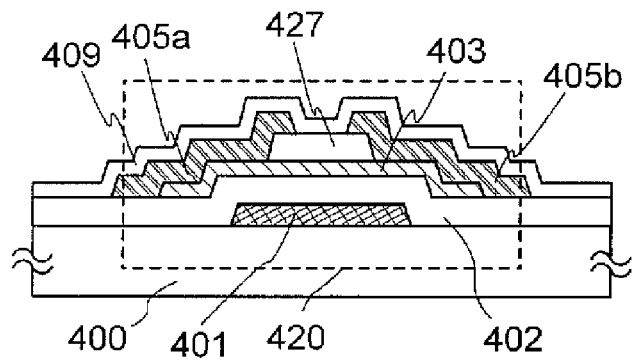

A transistor 420 illustrated in FIG. 11B is an example of a bottom-gate transistor referred to as a channel-protective (channel-stop) transistor and is also referred to as an inverted-staggered transistor.

The transistor 420 includes the gate electrode layer 401, the gate insulating layer 402, the oxide semiconductor layer 403, an insulating layer 427 functioning as a channel protective layer, the source electrode layer 405a, and the drain electrode layer 405b which are provided over the substrate 400 having an insulating surface. Further, the protective insulating layer 409 is provided.

Figure 11C:
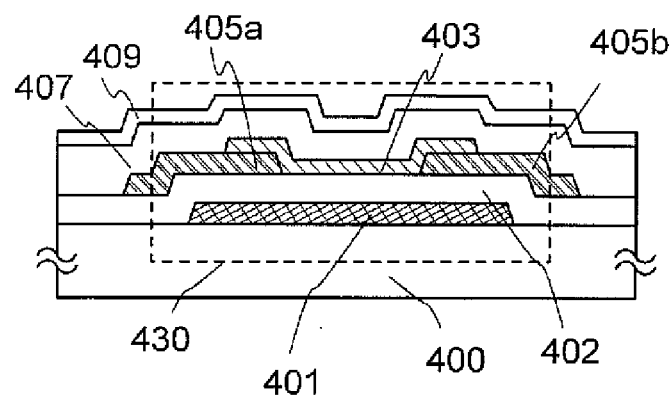

A transistor 430 illustrated in FIG. 11C is an example of a bottom-gate transistor. The transistor 430 includes the gate electrode layer 401, the gate insulating layer 402, the source electrode layer 405a, the drain electrode layer 405b, and the oxide semiconductor layer 403 which are provided over the substrate 400 having an insulating surface. Further, the insulating layer 407 which is in contact with the oxide semiconductor layer 403 is provided. Furthermore, the protective insulating layer 409 is formed over the insulating layer 407.

In the transistor 430, the gate insulating layer 402 is provided on and in contact with the substrate 400 and the gate electrode layer 401, and the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 11D:
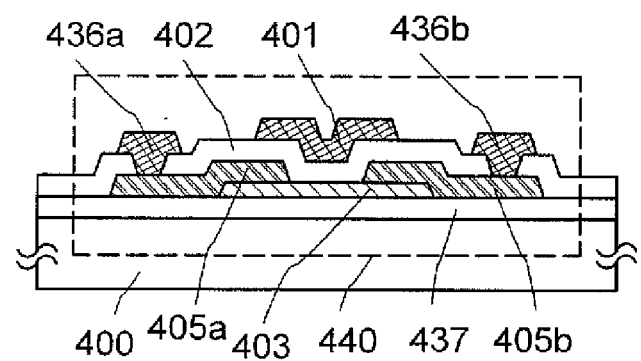

A transistor 440 illustrated in FIG. 11D is an example of a top-gate transistor. The transistor 440 includes an insulating layer 437, the oxide semiconductor layer 403, the source electrode layer 405a, the drain electrode layer 405b, the gate insulating layer 402, and the gate electrode layer 401 which are provided over the substrate 400 having an insulating surface. A wiring layer 436a and a wiring layer 436b are provided in contact with the source electrode layer 405a and the drain electrode layer 405b, respectively.

In this embodiment, as described above, the oxide semiconductor layer 403 is used as a semiconductor layer. As an oxide semiconductor used for the oxide semiconductor layer 403, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, all In—Al—Zn—O-based oxide semiconductor, a Sn—Ga—Zn—O-based oxide semiconductor, an Al—Ga—Zn—O-based oxide semiconductor layer, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or all In—Mg—O-based oxide semiconductor; an In—O-based oxide semiconductor, a Sn—O-based oxide semiconductor, or a Zn—O-based oxide semiconductor can be used. Further, $SiO_2$ may be added to the oxide semiconductor. Here, for example, an In—Ga—Zn—O-based oxide semiconductor is an oxide including at least In, Ga, and Zn, and there is no particular limitation on the composition ratio thereof. Furthermore, the In—Ga—Zn—O-based oxide semiconductor may contain an element other than In, Ga, and Zn.

For the oxide semiconductor layer 403, an oxide semiconductor expressed by a chemical formula of $InMO_3(ZnO)_m$ (m>0) can be used. Here, M represents one or more metal elements selected from Ga, Al, Mn, or Co. For example, Mean be Ga, Ga and Al, Ga and Mn, Ga and Co, or the like.

The off-state current of the transistor 410, the transistor 420, the transistor 430, and the transistor 440 including the oxide semiconductor layer 403 can be markedly reduced. Thus, when such transistors are used in the pulse signal output circuit and the shift register, the potential of each node can be kept easily, so that the possibility of a malfunction of the pulse signal output circuit and the shift register can be markedly lowered.

There is no particular limitation on a substrate which can be used as the substrate 400 having an insulating surface. For example, a glass substrate, a quartz substrate, or the like used for a liquid crystal display device or the like can be used.

Alternatively, a substrate where an insulating layer is formed over a silicon wafer may be used, for example.

In each of the bottom-gate transistors 410, 420, and 430, an insulating film serving as a base may be provided between the substrate and the gate electrode layer. The insulating layer has a function of preventing diffusion of an impurity element from the substrate, and can be formed to have a single-layer structure or a layered structure including one or more films selected from a silicon nitride film, a silicon oxide film, a silicon nitride oxide film, or a silicon oxynitride film.

The gate electrode layer 401 can be formed using a metal material such as molybdenum, titanium, chromium, tantalum, tungsten, aluminum, copper, neodymium, or scandium, or an alloy material which includes any of these materials as a main component. The gate electrode layer 401 may have a single-layer structure or a layered structure.

The gate insulating layer 402 can be formed using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or the like by a plasma-enhanced CVD method, a sputtering method, or the like. For example, a gate insulating layer with a total thickness of about 300 nm can be formed in such a manner that a silicon nitride film ($SiN_y$ ($y>0$)) with a thickness of 50 to 200 nm is formed as a first gate insulating layer by plasma-enhanced CVD and a silicon oxide film ($SiO_x$ ($x>0$)) with a thickness of 5 to 300 nm is stacked over the first gate insulating layer as a second gate insulating layer by a sputtering method.

The source electrode layer 405a and the drain electrode layer 405b can be formed using a metal material such as molybdenum, titanium, chromium, tantalum, tungsten, aluminum, copper, neodymium, or scandium, or an alloy material which includes any of these materials as a main component. For example, the source electrode layer 405a and the drain electrode layer 405b can have a layered structure of a metal layer including aluminum, copper, or the like and a refractory metal layer including titanium, molybdenum, tungsten, or the like. Heat resistance may be improved with the use of an aluminum material to which an element for preventing generation of hillocks and whiskers (e.g., silicon, neodymium, or scandium) is added.

Alternatively, a conductive metal oxide film may be used as a conductive film serving as the source electrode layer 405a and the drain electrode layer 405b (including a wiring layer formed using the same layer as the source electrode layer 405a and the drain electrode layer 405b). Indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), any of these metal oxide materials including silicon oxide, or the like can be used as a conductive metal oxide.

The wiring layer 436a and the wiring layer 436b which are in contact with the source electrode layer 405a and the drain electrode layer 405b, respectively, can be formed using a material which is similar to that of the source electrode layer 405a and the drain electrode layer 405b.

For each of the insulating layers 407, 427, and 437, an inorganic insulating film such as a silicon oxide film, a silicon oxynitride film, an aluminum oxide film, or an aluminum oxynitride film can be used typically.

For the protective insulating layer 409, an inorganic insulating film such as a silicon nitride film, an aluminum nitride film, a silicon nitride oxide film, or an aluminum nitride oxide film can be used.

In addition, a planarization insulating film for reducing surface unevenness due to the transistor may be formed over the protective insulating layer 409. For the planarization insulating film, an organic material such as polyimide, acrylic, or benzocyclobutene can be used. Other than such an organic material, a low-dielectric constant material (a low-k material) or the like can be used. Note that the planarization insulating film may be formed by stacking a plurality of insulating films including these materials.

As described above, the structures, methods, and the like described in this embodiment can be combined with any of the structures, methods, and the like described in the other embodiments as appropriate.

(Embodiment 4)

In this embodiment, an example of a transistor including an oxide semiconductor layer and an example of a manufacturing method thereof will be described in detail with reference to FIGS. 12A to 12E.

FIGS. 12A to 12E are cross-sectional views illustrating a manufacturing process of a transistor. A transistor 510 illustrated here is an inverted staggered transistor similar to the transistor 410 illustrated in FIG. 11A.

An oxide semiconductor used for a semiconductor layer of this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which is an n-type impurity, is removed from an oxide semiconductor, and the oxide semiconductor is purified so as to contain as few impurities that are not main components of the oxide semiconductor as possible.

Note that the purified oxide semiconductor includes extremely few carriers, and the carrier concentration is lower than $1\times10^{14}$ /cm$^3$, preferably lower than $1\times10^{12}$ /cm$^3$, further preferably lower than $1\times10^{11}$ /cm$^3$. Such few carriers enable a current in an off state (off-state current) to be small enough.

Specifically, in the transistor including the above-described oxide semiconductor layer, the off-state current density per 1 μm of channel width at room temperature (25° C.) can be 100 zA/μm ($1\times10^{-19}$ A/μm) or lower, or further 10 zA/μm ($1\times10^{-20}$ A/μm) or lower under conditions where the channel length L of the transistor is 10 μm and the source-drain voltage is 3 V.

The transistor 510 including the purified oxide semiconductor layer hardly has temperature dependence of an on-state current and also has an extremely small off-state current.

A process for manufacturing the transistor 510 over a substrate 505 will be described with reference to FIGS. 12A to 12E.

First, a conductive film is formed over the substrate 505 having an insulating surface, and then a gate electrode layer 511 is formed through a first photolithography process. Note that a resist mask used in the photolithography process may be formed by an inkjet method. Formation of the resist mask by an inkjet method needs no photomask; thus, manufacturing cost can be reduced.

As the substrate 505 having an insulating surface, a substrate similar to the substrate 400 described in the above embodiment can be used. In this embodiment, a glass substrate is used as the substrate 505.

An insulating layer serving as a base may be provided between the substrate 505 and the gate electrode layer 511. The insulating layer has a function of preventing diffusion of an impurity element from the substrate 505, and can be formed of one or more films selected from a silicon nitride film, a silicon oxide film, a silicon nitride oxide film, a silicon oxynitride film, and the like.

The gate electrode layer 511 can be formed using a metal material such as molybdenum, titanium, chromium, tantalum, tungsten, aluminum, copper, neodymium, or scandium, or an alloy material which includes any of these metal materials as a main component. The gate electrode layer 511 can have a single-layer structure or a stacked structure.

Next, a gate insulating layer 507 is formed over the gate electrode layer 511. The gate insulating layer 507 can be formed by a plasma-enhanced CVD method, a sputtering method, or the like. The gate insulating layer 507 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

Further, in order that hydrogen, hydroxyl, and moisture are contained as little as possible in the gate insulating layer 507 and an oxide semiconductor film 530, it is preferable to preheat the substrate 505 over which the gate electrode layer 511 is formed or the substrate 505 over which the gate electrode layer 511 and the gate insulating layer 507 are formed, in a preheating chamber of a sputtering apparatus as pretreatment for the formation of the oxide semiconductor film 530, so that impurities such as hydrogen and moisture adsorbed on the substrate 505 are eliminated. As an evacuation unit, a cryopump is preferably provided for the preheating chamber. This preheating step may be performed on the substrate 505 over which layers up to and including a source electrode layer 515a and a drain electrode layer 515b are formed. Note that this preheating treatment can be omitted.

Figure 12A:
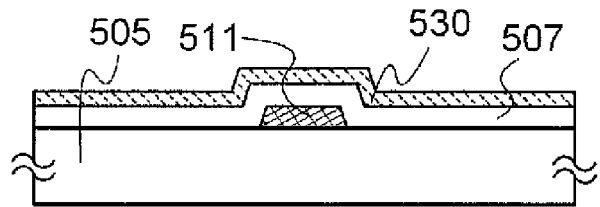
FIGS. 12A to 12E illustrate an example of a method for manufacturing a transistor.

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 12A).

For the oxide semiconductor film 530, any of the four-component metal oxide, the three-component metal oxides, the two-component metal oxides, an In—O-based oxide semiconductor, a Sn—O-based oxide semiconductor, a Zn—O-based oxide semiconductor, and the like, which are described in the above embodiment, can be used.

As a target for forming the oxide semiconductor film 530 by a sputtering method, it is particularly preferable to use a target having a composition ratio of In:Ga:Zn=1:x:y (x is 0 or more and y is more than or equal to 0.5 and less than or equal to 5). For example, a target having a composition ratio of $In_2O_3:Ga_2O_3:ZnO=1:1:2$ [molar ratio] can be used. Alternatively, a target having a composition ratio of $In_2O_3:Ga_2O_3:ZnO=1:1:1$ [molar ratio], a target having a composition ratio of $In_2O_3:Ga_2O_3:ZnO=1:1:4$ [molar ratio], or a target having a composition ratio of $In_2O_3:ZnO=1:2$ [molar ratio] can be used.

In this embodiment, an oxide semiconductor layer having an amorphous structure is formed by a sputtering method using an In—Ga—Zn—O-based metal oxide target.

The relative density of a metal oxide in the metal oxide target is greater than or equal to 80%, preferably greater than or equal to 95%, and further preferably greater than or equal to 99.9%. The use of a metal oxide target having high relative density makes it possible to form an oxide semiconductor layer with a dense structure.

The atmosphere in which the oxide semiconductor film 530 is formed is preferably a rare gas (typically, argon) atmosphere, an oxygen atmosphere, or a mixed atmosphere containing a rare gas (typically, argon) and oxygen. Specifically, it is preferable to use, for example, an atmosphere of a high-purity gas from which an impurity such as hydrogen, water, hydroxyl, or hydride is removed so that the impurity concentration is 1 ppm or lower (preferably the impurity concentration is 10 ppb or lower).

In the formation of the oxide semiconductor film 530, for example, a process object is held in a treatment chamber that is kept under reduced pressure and the process object may be heated so that the temperature of the process object is higher than or equal to 100° C. and lower than 550° C., preferably higher than or equal to 200° C. and lower than or equal to 400° C. Alternatively, the temperature of the process object in the formation of the oxide semiconductor film 530 may be room temperature (25° C.±10° C.). Then, a sputtering gas from which hydrogen, water, and the like are removed is introduced while moisture in the treatment chamber is removed, and the aforementioned target is used, whereby the oxide semiconductor film 530 is formed. The oxide semiconductor film 530 is formed while the process object is heated, so that impurities contained in the oxide semiconductor layer can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo molecular pump provided with a cold trap may be used. By evacuation with the cryopump or the like, hydrogen, water, and the like can be removed from the treatment chamber, whereby the impurity concentration in the oxide semiconductor film 530 can be reduced.

The oxide semiconductor film 530 can be formed under the following conditions, for example: the distance between the process object and the target is 170 mm, the pressure is 0.4 Pa, the direct-current (DC) power is 0.5 kW, and the atmosphere is an oxygen atmosphere (the proportion of oxygen is 100%), an argon atmosphere (the proportion of argon is 100%), or a mixed atmosphere including oxygen and argon. A pulse-direct current (DC) power source is preferably used because powder substances (also referred to as particles or dust) generated in the film formation can be reduced and the film thickness can be uniform. The thickness of the oxide semiconductor film 530 is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor film 530 having such a thickness, a short-channel effect due to miniaturization can be suppressed. Note that the appropriate thickness differs depending on the oxide semiconductor material to be used, the intended use of the semiconductor device, and the like; therefore, the thickness may be determined in accordance with the material, the intended use, and the like.

Note that before the oxide semiconductor film 530 is formed by a sputtering method, a substance attached to a surface where the oxide semiconductor film 530 is to be formed (e.g., a surface of the gate insulating layer 507) is preferably removed by reverse sputtering in which an argon gas is introduced and plasma is generated. Here, the reverse sputtering is a method in which ions collide with a process surface so that the surface is modified, in contrast to normal sputtering in which ions collide with a sputtering target. As an example of a method for making ions collide with a process surface, there is a method in which high-frequency voltage is applied to the process surface in an argon atmosphere so that plasma is generated in the vicinity of the process object. Note that an atmosphere of nitrogen, helium, oxygen, or the like may be used instead of an argon atmosphere.

Next, the oxide semiconductor film 530 is processed into an island-shaped oxide semiconductor layer through a second photolithography process. Note that a resist mask used in the photolithography process may be formed by an inkjet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

As the etching of the oxide semiconductor film 530, either wet etching or dry etching or both of them may be employed. As an etchant used for wet etching of the oxide semiconductor film 530, a solution obtained by mixing phosphoric acid, acetic acid, and nitric acid or the like can be used. An etchant such as ITO-07N (produced by KANTO CHEMICAL CO., INC.) may also be used.

Figure 12B:
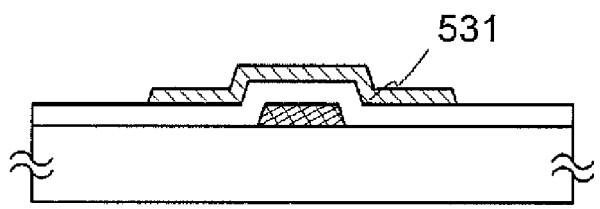

Then, heat treatment (first heat treatment) is performed on the oxide semiconductor layer, so that an oxide semiconductor layer 531 is formed (see FIG. 12B). By the first heat treatment, excessive hydrogen (including water and hydroxyl) in the oxide semiconductor layer is removed and a structure of the oxide semiconductor layer is improved, so that defect level in energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, a process object is introduced into an electric furnace in which a resistance heating element or the like is used and heated at 450° C. under a nitrogen atmosphere for an hour. During the heat treatment, the oxide semiconductor layer is not exposed to the air, in order to prevent contamination by water and hydrogen.

The heat treatment apparatus is not limited to an electric furnace; the heat treatment apparatus can be an apparatus that heats a process object using thermal conduction or thermal radiation from a medium such as a heated gas or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object using radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, GRTA treatment may be performed in the following manner. The process object is put in an inert gas atmosphere that has been heated, heated for several minutes, and then taken out of the inert gas atmosphere. The GRTA treatment enables high-temperature heat treatment in a short time. Moreover, in the GRTA treatment, even conditions of the temperature that exceeds the upper temperature limit of the process object can be employed. Note that the inert gas may be changed to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, impurities are reduced by the first heat treatment so that the i-type (intrinsic) or substantially i-type oxide semiconductor layer is obtained. Accordingly, a transistor having excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can be performed after the formation of the oxide semiconductor film 530 and before the oxide semiconductor film 530 is processed into the island-shaped oxide semiconductor layer. Such dehydration treatment or dehydrogenation treatment may be performed once or more times.

The first heat treatment can be performed at any of the following timings instead of the above timing: after formation of a source electrode layer and a drain electrode layer, after formation of an insulating layer over the source electrode layer and the drain electrode layer, and the like.

Next, a conductive film to be a source electrode layer and a drain electrode layer (including a wiring formed from the same layer as the source electrode layer and the drain electrode layer) is formed over the gate insulating layer 507 and the oxide semiconductor layer 531. The conductive film used to form the source electrode layer and the drain electrode layer can be formed using any of the materials described in the above embodiment.

Figure 12C:
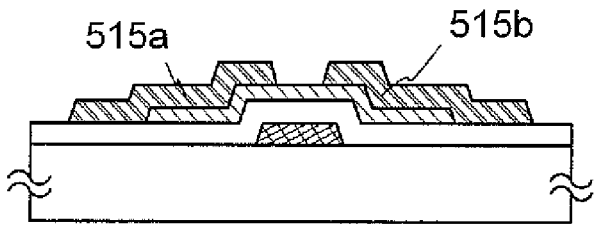

A resist mask is formed over the conductive film in a third photolithography process, and the source electrode layer 515a and the drain electrode layer 515b are formed by selective etching, and then, the resist mask is removed (see FIG. 12C).

Light exposure at the time of formation of the resist mask in the third photolithography process may be performed using ultraviolet light, KrF laser light, or ArF laser light. Note that the channel length (L) of the transistor is determined by the distance between the source electrode layer and the drain electrode layer. Therefore, in light exposure for forming a mask for a transistor with a channel length (L) of less than 25 rim, it is preferable to use extreme ultraviolet light whose wavelength is as short as several nanometers to several tens of nanometers. In light exposure using extreme ultraviolet light, resolution is high and depth of focus is large. For these reasons, the channel length (L) of the transistor completed later can be greater than or equal to 10 nm and less than or equal to 1000 nm (1 μm), and the circuit can operate at high speed. Moreover, power consumption of the semiconductor device can be reduced by miniaturization.

In order to reduce the number of photomasks and the number of photolithography processes, the etching step may be performed using a resist mask formed with a multi-tone mask. Since a resist mask formed with a multi-tone mask includes regions of plural thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography processes can also be reduced, whereby simplification of the process can be realized.

Note that it is preferable that etching conditions be optimized so as not to etch and divide the oxide semiconductor layer 531 when the conductive film is etched. However, it is difficult to obtain etching conditions in which only the conductive film is etched and the oxide semiconductor layer 531 is not etched at all. In some cases, part of the oxide semiconductor layer 531 is etched when the conductive film is etched, whereby the oxide semiconductor layer 531 having a groove portion (a recessed portion) is formed.

Either wet etching or dry etching may be used for the etching of the conductive film. Note that dry etching is preferably used in terms of miniaturization of elements. An etching gas and an etchant can be selected as appropriate in accordance with a material to be etched. In this embodiment, a titanium film is used as the conductive film and an In—Ga—Zn—O based material is used for the oxide semiconductor layer 531; accordingly, in the case of employing wet etching, ammonia hydrogen peroxide (a mixed solution of ammonia, water, and hydrogen peroxide) is used as an etchant.

Next, plasma treatment using a gas such as $N_2O$, $N_2$, or Ar is preferably performed, so that water, hydrogen, or the like attached to a surface of an exposed portion of the oxide semiconductor layer may be removed. hi the case of performing the plasma treatment, an insulating layer 516 serving as a protective insulating film is formed without the oxide semiconductor layer being exposed to the air after the plasma treatment.

The insulating layer 516 is preferably formed to a thickness of at least 1 nm by a method through which an impurity such as water or hydrogen is not introduced into the insulating layer 516, such as a sputtering method. When hydrogen is contained in the insulating layer 516, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. As the insulating layer 516, a silicon oxide film, a silicon oxynitride film, an aluminum oxide film, an aluminum oxynitride film, or the like is preferably used.

In this embodiment, a silicon oxide film is formed to a thickness of 200 nm by a sputtering method as the insulating layer 516. The substrate temperature in deposition may be higher than or equal to room temperature (25° C.) and lower than or equal to 300° C., and is 100° C. in this embodiment. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target may be used.

In order to remove moisture remaining in the deposition chamber of the insulating layer 516 at the same time as deposition of the oxide semiconductor film 530, an entrapment vacuum pump (such as a cryopump) is preferably used. When the insulating layer 516 is deposited in the deposition chamber which is evacuated using a cryopump, the impurity concentration in the insulating layer 516 can be reduced. A turbo molecular pump provided with a cold trap may be used as an evacuation unit for removing moisture remaining in the deposition chamber used for forming the insulating layer 516.

A sputtering gas used for forming the insulating layer 516 is preferably a high-purity gas from which an impurity such as hydrogen or water is removed.

Next, second heat treatment is performed in an inert gas atmosphere or an oxygen gas atmosphere. The second heat treatment is performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. By supply of oxygen from the insulating layer 516 to the oxide semiconductor layer 531, an oxygen vacancy in the oxide semiconductor layer 531 is reduced, whereby an i-type (intrinsic) or substantially i-type oxide semiconductor layer can be formed.

In this embodiment, the second heat treatment is performed after the formation of the insulating layer 516; however, the timing of the second heat treatment is not limited thereto. For example, the first heat treatment and the second heat treatment may be successively performed, or the first heat treatment may double as the second heat treatment.

In the above-described manner, through the first heat treatment and the second heat treatment, the oxide semiconductor layer 531 is purified so as to contain as few impurities that are not main components of the oxide semiconductor layer as possible, whereby the oxide semiconductor layer 531 can become an i-type (intrinsic) oxide semiconductor layer.

Figure 12D:
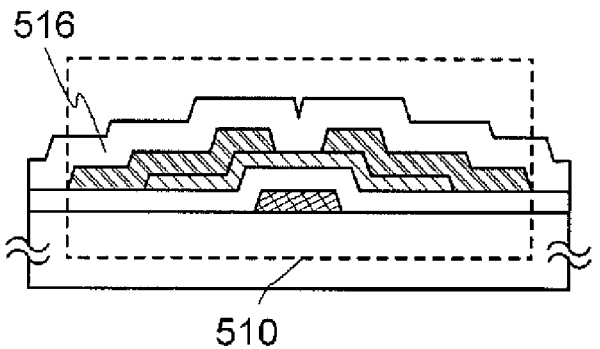

Through the above-described process, the transistor 510 is formed (see FIG. 12D).

Figure 12E:
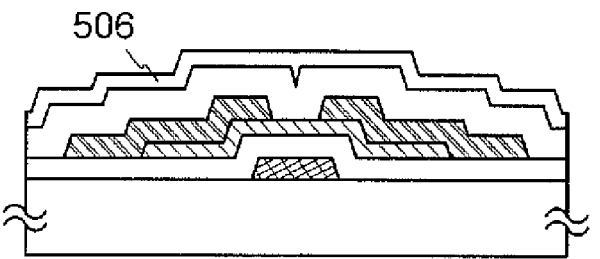

It is preferable to further form a protective insulating layer 506 over the insulating layer 516 (see FIG. 12E). The protective insulating layer 506 prevents entry of hydrogen, water, and the like from the outside. As the protective insulating layer 506, a silicon nitride film, an aluminum nitride film, or the like can be used, for example. The formation method of the protective insulating layer 506 is not particularly limited; however, an RF sputtering method is suitable for forming the protective insulating layer 506 because it achieves high productivity.

After the formation of the protective insulating layer 506, heat treatment may be further performed at a temperature higher than or equal to 100° C. and lower than or equal to 200° C. for 1 hour to 30 hours in the air.

A transistor which includes a purified oxide semiconductor layer and is manufactured in accordance with this embodiment as described above has a characteristic of significantly small off-state current. Therefore, with the use of such a transistor, the potential of a node can be easily kept. The use of such a transistor for a pulse signal output circuit and a shift register can significantly reduce the probability of causing a malfunction of the pulse signal output circuit and the shift register.

As described above, the structures, methods, and the like described in this embodiment can be combined with any of the structures, methods, and the like described in the other embodiments as appropriate.

(Embodiment 5)

With the use of the shift register whose example is illustrated in Embodiment 1 or Embodiment 2, a semiconductor device having a display function (also referred to as a display device) can be manufactured. Further, part or whole of a driver circuit can be formed over the same substrate as a pixel portion, whereby a system-on-panel can be obtained.

As a display element used for the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 13A:
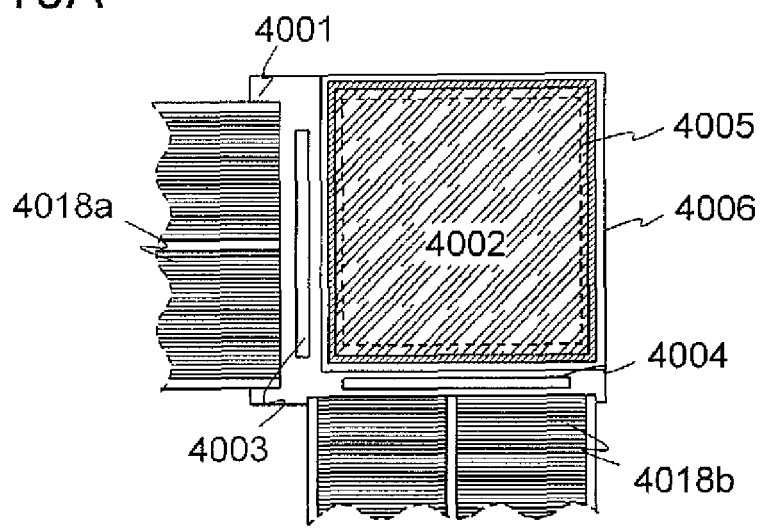
FIGS. 13A to 13C illustrate examples of semiconductor devices.

In FIG. 13A, a sealant 4005 is provided so as to surround a pixel portion 4002 provided over a first substrate 4001, and the pixel portion 4002 is sealed between the first substrate 4001 and a second substrate 4006. In FIG. 13A, a scan line driver circuit 4004 and a signal line driver circuit 4003 which are formed over a substrate separately prepared are mounted in a region which is not included in a region surrounded by the sealant 4005 over the first substrate 4001. Further, a variety of signals and potentials are supplied to the signal line driver circuit 4003 which is separately formed, and the scan line driver circuit 4004 or the pixel portion 4002 from flexible printed circuits (FPCs) 4018*a* and 4018*b*.

Figure 13B:
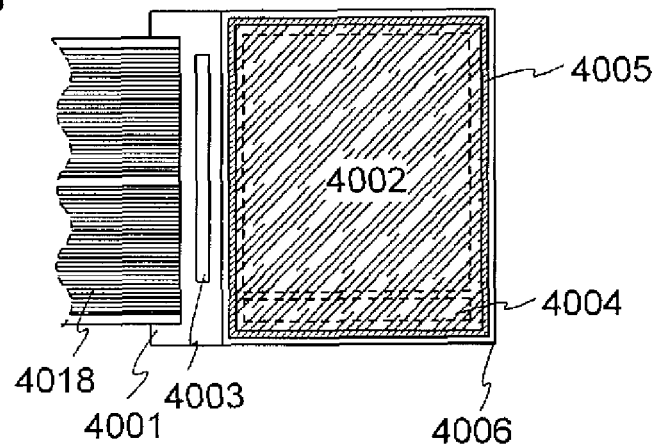
Figure 13C:
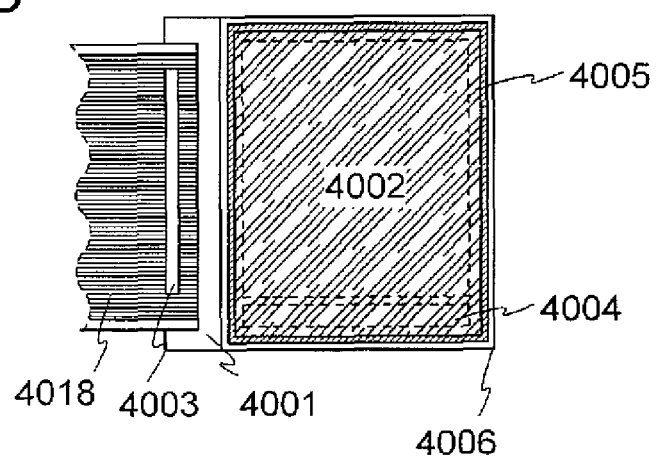

In FIGS. 13B and 13C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element by the first substrate 4001, the sealant 4005, and the second substrate 4006. In FIGS. 13B and 13C, the signal line driver circuit 4003 which is formed over a substrate separately prepared is mounted in a region which is different from a region surrounded by the sealant 4005 over the first substrate 4001. In FIGS. 13B and 13C, a variety of signals and potentials are supplied to the signal line driver circuit 4003 which is separately formed, and the scan line driver circuit 4004 or the pixel portion 4002 from an FPC 4018.

Although FIGS. 13B and 13C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 13A illustrates an example in which the signal line driver circuit 4003 and the scan line driver circuit 4004 are mounted by a COG method. FIG. 13B illustrates an example in which the signal line driver circuit 4003 is mounted by a COG method. FIG. 13C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion provided over the first substrate includes a plurality of transistors, and the transistors which are illustrated in the aforementioned embodiment as an example can be used for the transistors.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like is used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral agent is mixed is used for a liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, an alignment film does not need to be provided and thus rubbing treatment is not necessary. Therefore, electrostatic discharge damage caused by the rubbing treatment can be prevented and defects and damage of the liquid crystal display device in the manufacturing process can be reduced. Thus, productivity of the liquid crystal display device can be increased.

The specific resistivity of the liquid crystal material is greater than or equal to $1 \times 10^9$ $\Omega \cdot$cm, preferably greater than or equal to $1 \times 10^{12}$ $\Omega \cdot$cm, still preferably greater than or equal to $1 \times 10^{12}$ $\Omega \cdot$cm. Note that the specific resistance in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like.

For the liquid crystal display device, a twisted nematic (TN) mode, an in-plane-switching (IPS) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, or the like is used.

A normally black liquid crystal display device such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

Furthermore, the present invention can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical element (an optical substrate) such as a polarizing element, a retardation element, or an anti-reflection element, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, the light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control alignment of the spherical particles, so that display is performed.

The pulse signal output circuit illustrated in Embodiment 1 or Embodiment 2 is used for the display device whose example is illustrated as above, whereby the display device can have a variety of functions.

As described above, the structures, methods, and the like described in this embodiment can be combined with any of the structures, methods, and the like described in the other embodiments as appropriate.

(Embodiment 6)

A semiconductor device disclosed in this specification can be used in a variety of electronic devices (including game machines). Examples of electronic devices are a television set (also referred to as a television or a television receiver), a monitor of a computer or the like, a camera such as a digital camera or a digital video camera, a digital photo frame, a cellular phone handset (also referred to as a cellular phone or a cellular phone device), a portable game machine, a personal digital assistant, an audio reproducing device, a large game machine such as a pinball machine, and the like.

Figure 14A:
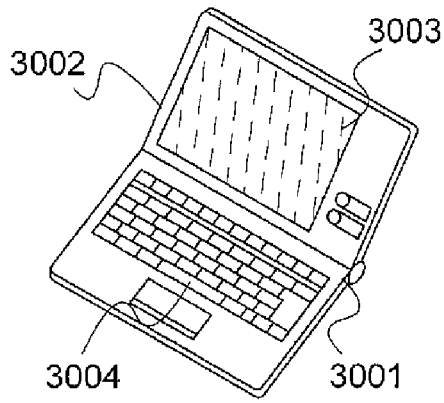
FIGS. 14A to 14F illustrate electronic devices.

FIG. 14A illustrates a laptop personal computer which includes at least the semiconductor device disclosed in this specification as a component. The laptop personal computer includes a main body 3001, a housing 3002, a display portion 3003, a keyboard 3004, and the like.

Figure 14B:
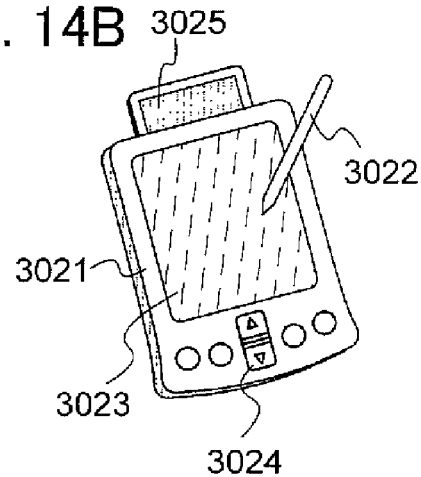

FIG. 14B illustrates a personal digital assistant (PDA) which includes at least the semiconductor device disclosed in this specification as a component. The personal digital assistant includes a display portion 3023, an external interface 3025, operation buttons 3024, and the like in a main body 3021. A stylus 3022 is included as an accessory for operation.

Figure 14C:
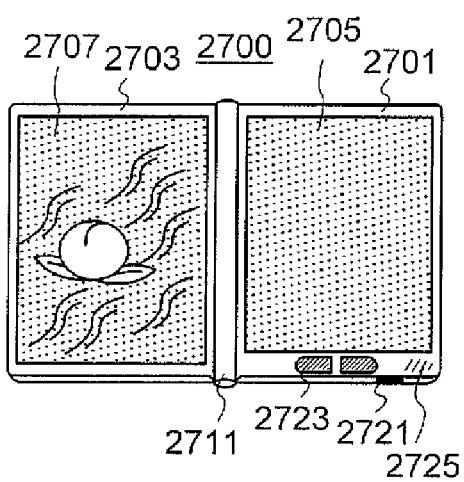

The semiconductor device disclosed in this specification can be used as electronic paper. FIG. 14C illustrates an e-book reader which includes the electronic paper as a component. FIG. 14C illustrates an example of the e-book reader. For example, an e-book reader 2700 includes two housings 2701 and 2703. The housings 2701 and 2703 are combined with each other with a hinge 2711 so that the e-book reader 2700 can be opened and closed with the hinge 2711 used as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 14C) can display text and a display portion on the left side (the display portion 2707 in FIG. 14C) can display images.

FIG. 14C illustrates an example in which the housing 2701 includes an operation portion and the like. For example, the housing 2701 includes a power switch 2721, operation keys 2723, a speaker 2725, and the like. With the operation key 2723, pages can be turned. Note that a keyboard, a pointing device, or the like may be provided on the same surface as the display portion of the housing. Further, an external connection terminal (e.g., an earphone terminal or a USB terminal), a recording medium insertion portion, and the like may be provided on a back surface or a side surface of the housing. Furthermore, the e-book reader 2700 may function as an electronic dictionary.

Further, the e-book reader 2700 may transmit and receive data wirelessly. Through wireless communication, desired book data or the like can be purchased and downloaded from an electronic book server.

Figure 14D:
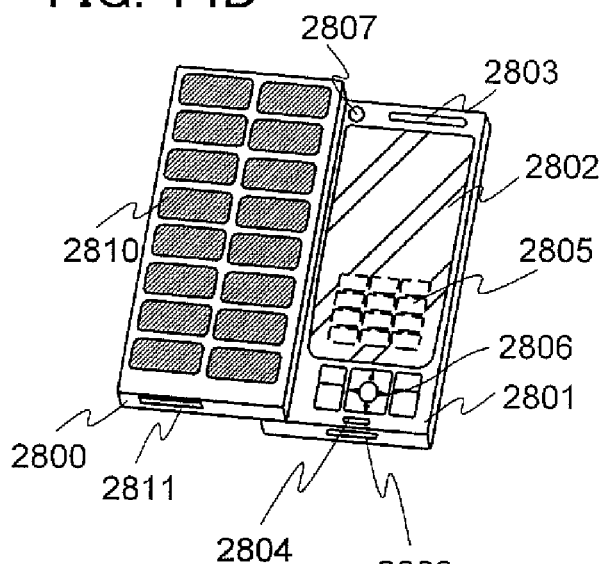

FIG. 14D illustrates a cellular phone which includes at least the semiconductor device disclosed in this specification as a component. The cellular phone includes two housings 2800 and 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for storing electricity in a personal digital assistant, an external memory slot 2811, and the like, Further, an antenna is incorporated in the housing 2801.

Further, the display panel 2802 includes a touch panel. A plurality of operation keys 2805 which are displayed as images are indicated by dashed lines in FIG. 14D. Note that the cellular phone includes a DC-DC converter for raising voltage output from the solar cell 2810 to voltage needed in each circuit.

The display direction of the display panel 2802 is changed as appropriate depending on a usage pattern. Further, since the cellular phone includes the camera lens 2807 on the same surface as the display panel 2802, it can be used as a video phone. The speaker 2803 and the microphone 2804 can be used for videophone calls, recording, playback, and the like as well as voice calls. Furthermore, the housings 2800 and 2801 which are developed as illustrated in FIG. 14D can overlap with each other by sliding; thus, the size of the cellular phone can be decreased, which makes the cellular phone suitable for being carried.

The external connection terminal 2808 can be connected to an AC adapter and a variety of cables such as a USB cable, and charging and data communication with a personal computer or the like are possible. Further, a large amount of data can be stored and moved by insertion of a storage medium into the external memory slot 2811.

Further, the cellular phone may have an infrared communication function, a television reception function, or the like in addition to the above functions.

Figure 14E:
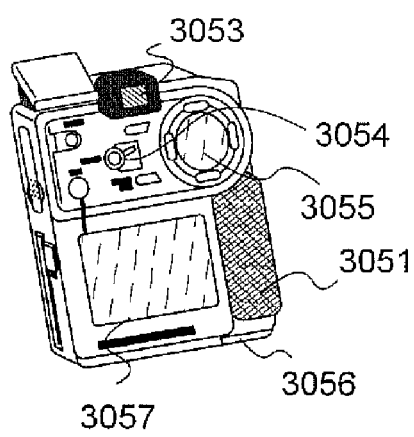

FIG. 14E illustrates a digital video camera which includes at least the semiconductor device disclosed in this specification as a component. The digital video camera includes a main body 3051, a first display portion 3057, an eye piece portion 3053, operation switches 3054, a second display portion 3055, a battery 3056, and the like.

Figure 14F:
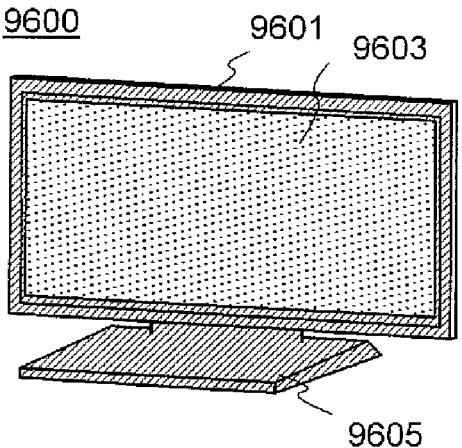

FIG. 14F illustrates an example of a television set which includes at least the semiconductor device disclosed in this specification as a component. In a television set 9600, a display portion 9603 is incorporated in a housing 9601. The display portion 9603 can display images. Here, the housing 9601 is supported by a stand 9605.

The television set 9600 can be operated by an operation switch of the housing 9601 or a remote control. Further, the remote control may include a display portion for displaying data output from the remote control.

Note that the television set 9600 includes a receiver, a modem, and the like. With the receiver, general television broadcasts can be received. Further, when the television set is connected to a communication network with or without wires via the modem, one-way (from a transmitter to a receiver) or two-way (between a transmitter and a receiver or between receivers) data communication can be performed.

As described above, the structures, methods, and the like described in this embodiment can be combined with any of the structures, methods, and the like described in the other embodiments as appropriate.

This application is based on Japanese Patent Application serial no. 2010-044949 filed with Japan Patent Office on Mar. 2, 2010, the entire contents of which are hereby incorporated by reference.

The invention claimed is:

1. A pulse signal output circuit comprising:
   a first transistor and a second transistor, a first terminal of the first transistor and a first terminal of the second transistor being electrically connected to a first output terminal;
   a third transistor and a fourth transistor, a first terminal of the third transistor and a first terminal of the fourth transistor being electrically connected to a second output terminal;
   a fifth transistor; and
   a sixth transistor,
   wherein a first terminal of the fifth transistor, a gate of the first transistor and a gate of the third transistor are electrically connected to each other;
   wherein a gate of the fifth transistor, a first terminal of the sixth transistor, a gate of the second transistor and a gate of the fourth transistor are electrically connected to each other; and
   wherein a channel of the fifth transistor and a channel of the sixth transistor are each longer than a channel of the third transistor and a channel of the fourth transistor.

2. A pulse signal output circuit comprising:
   a first transistor and a second transistor, a first terminal of the first transistor and a first terminal of the second transistor being electrically connected to a first output terminal;
   a third transistor and a fourth transistor, a first terminal of the third transistor and a first terminal of the fourth transistor being electrically connected to a second output terminal;
   a first input signal generation circuit comprising a fifth transistor; and
   a second input signal generation circuit comprising a sixth transistor,
   wherein a first terminal of the fifth transistor, a gate of the first transistor and a gate of the third transistor are electrically connected to each other;
   wherein a gate of the fifth transistor, a first terminal of the sixth transistor, a gate of the second transistor and a gate of the fourth transistor are electrically connected to each other; and
   wherein a channel of the fifth transistor and a channel of the sixth transistor are each longer than a channel of the third transistor and a channel of the fourth transistor.

3. A pulse signal output circuit according to claim 2, wherein a second terminal of the fifth transistor and a second terminal of the sixth transistor are electrically connected to a power supply line.

4. A pulse signal output circuit according to claim 2, further comprising a capacitor electrically connected between the gate and a second terminal of the second transistor.

5. A pulse signal output circuit according to claim 2, wherein any one of the fifth transistor and the sixth transistor is a transistor having a multi-gate structure where at least two gates are arranged in series.

6. A pulse signal output circuit according to claim 2, wherein any one of the transistors includes an oxide semiconductor.

7. A shift register circuit including a pulse signal output circuit according to claim 2.

8. An electronic device including a pulse signal output circuit according to claim 2.

9. A pulse signal output circuit comprising:
a first transistor and a second transistor, a first terminal of the first transistor and a first terminal of the second transistor being electrically connected to a first output terminal;
a third transistor and a fourth transistor, a first terminal of the third transistor and a first terminal of the fourth transistor being electrically connected to a second output terminal;
a first input signal generation circuit comprising a fifth transistor and a sixth transistor; and
a second input signal generation circuit comprising a seventh transistor, an eighth transistor and a ninth transistor,
wherein a first terminal of the fifth transistor, a first terminal of the sixth transistor, a gate of the first transistor and a gate of the third transistor are electrically connected to each other;
wherein a gate of the sixth transistor, a first terminal of the seventh transistor, a first terminal of the eighth transistor, a first terminal of the ninth transistor, a gate of the second transistor and a gate of the fourth transistor are electrically connected to each other; and
wherein a channel of the sixth transistor and a channel of the ninth transistor are each longer than a channel of the third transistor and a channel of the fourth transistor.

10. A pulse signal output circuit according to claim 9,
wherein a first power supply line is electrically connected to a second terminal of the fifth transistor, a second terminal of the seventh transistor and a second terminal of the eighth transistor;
wherein a second power supply line is electrically connected to a second terminal of the sixth transistor, a second terminal of the ninth transistor, a second terminal of the second transistor and a second terminal of the fourth transistor;
wherein a pulse signal line is electrically connected to a gate of the fifth transistor and a gate of the ninth transistor;
wherein a first clock signal line is electrically connected to a second terminal of the first transistor and a second terminal of the third transistor;
wherein a second clock signal line is electrically connected to a gate of the eighth transistor; and
wherein an input line is electrically connected to a gate of the seventh transistor.

11. A pulse signal output circuit according to claim 9, further comprising a tenth transistor configured to control an electrical connection of the first terminal of the fifth transistor and the first terminal of the sixth transistor to the gate of the first transistor and the gate of the third transistor,
wherein a gate of the tenth transistor is electrically connected a second terminal of the fifth transistor.

12. A pulse signal output circuit according to claim 9, further comprising an eleventh transistor having a first terminal electrically connected to a second terminal of the eighth transistor,
wherein a gate of the eleventh transistor is electrically connected to a clock signal line.

13. A pulse signal output circuit according to claim 9, further comprising a capacitor electrically connected between the gate and a second terminal of the second transistor.

14. A pulse signal output circuit according to claim 9, wherein any one of the sixth transistor and the ninth transistor is a transistor having a multi-gate structure where at least two gates are arranged in series.

15. A pulse signal output circuit according to claim 9, wherein any one of the transistors includes an oxide semiconductor.

16. A shift register circuit including a pulse signal output circuit according to claim 9.

17. An electronic device including a pulse signal output circuit according to claim 9.

* * * * *

UNITED STATES PATENT AND TRADEMARK OFFICE
CERTIFICATE OF CORRECTION

PATENT NO. : 8,320,516 B2
APPLICATION NO. : 13/031717
DATED : November 27, 2012
INVENTOR(S) : Kouhei Toyotaka It is certified that error appears in the above-identified patent and that said Letters Patent is hereby corrected as shown below:

Column 3, line 65, replace "all" with --an--;

Column 4, line 25, replace "all" with --an--;

Column 6, line 28, replace "$10\_4$" with --$10\_k$--;

Column 6, line 31, replace "$10\_{n\text{-}I}$" with --$10\_{n-1}$--;

Column 16, line 34, replace "all" with --an--;

Column 16, line 42, replace "all" with --an--;

Column 16, line 54, replace "Mean" with --M can--;

Column 22, line 42, replace "rim," with --nm,--;

Column 23, line 19, replace "hi" with --In--.

Signed and Sealed this
Second Day of April, 2013

Teresa Stanek Rea
*Acting Director of the United States Patent and Trademark Office*